United States Patent
Flynn et al.

(10) Patent No.: US 7,919,791 B2
(45) Date of Patent: Apr. 5, 2011

(54) DOPED GROUP III-V NITRIDE MATERIALS, AND MICROELECTRONIC DEVICES AND DEVICE PRECURSOR STRUCTURES COMPRISING SAME

(75) Inventors: Jeffrey S. Flynn, Litchfield, CT (US); George R. Brandes, Southbury, CT (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 10/107,001

(22) Filed: Mar. 25, 2002

(65) Prior Publication Data
US 2003/0178633 A1 Sep. 25, 2003

(51) Int. Cl.
*H01L 29/778* (2006.01)
(52) U.S. Cl. ......... 257/194; 257/E29.246; 257/E29.248; 257/27
(58) Field of Classification Search ........... 257/194
See application file for complete search history.

(56) References Cited

U.S. PATENT DOCUMENTS

| | | | | |
|---|---|---|---|---|
| 4,780,748 A * | 10/1988 | Cunningham et al. | ....... | 257/24 |
| 5,329,150 A * | 7/1994 | Schubert et al. | ....... | 257/458 |
| 5,831,277 A * | 11/1998 | Razeghi | ....... | 257/15 |
| 5,965,931 A * | 10/1999 | Wang et al. | ....... | 257/585 |
| 6,064,082 A * | 5/2000 | Kawai et al. | ....... | 257/192 |
| 6,110,813 A * | 8/2000 | Ota et al. | ....... | 438/597 |
| 6,156,581 A | 12/2000 | Vaudo et al. | | |
| 6,274,889 B1 * | 8/2001 | Ota et al. | ....... | 257/77 |
| 6,316,793 B1 | 11/2001 | Sheppard et al. | | |
| 6,342,411 B1 | 1/2002 | Pitts, Jr. | | |
| 6,465,814 B2 | 10/2002 | Kasahara et al. | | |
| 6,479,836 B1 * | 11/2002 | Suzuki et al. | ....... | 257/15 |
| 6,489,628 B1 | 12/2002 | Morizuka | | |
| 6,498,360 B1 * | 12/2002 | Jain et al. | ....... | 257/194 |
| 6,552,373 B2 | 4/2003 | Ando et al. | | |
| 6,849,882 B2 * | 2/2005 | Chavarkar et al. | ....... | 257/191 |
| 6,992,319 B2 * | 1/2006 | Fahimulla et al. | ....... | 257/20 |
| 2002/0017696 A1 | 2/2002 | Nakayama et al. | | |
| 2002/0096692 A1 * | 7/2002 | Nakamura et al. | ....... | 257/194 |

FOREIGN PATENT DOCUMENTS

EP 0 841 704 A1 5/1998
(Continued)

OTHER PUBLICATIONS

Asbeck et al, Electronics Letters "Piezoelectrioc charge densities in AlGaN/GaN HFETs" Jul. 3, 1997 vol. 33 No. 14 pp. 1230-1231.*
Maeda et al "Two-dimensional . . . transistors" Applied Physics Letters vol. 73 No. 13 Sep. 28, 1998.*

(Continued)

*Primary Examiner* — Jerome Jackson, Jr.
(74) *Attorney, Agent, or Firm* — Vincent K. Gustafson; Hultquist IP

(57) ABSTRACT

A Group III-V nitride microelectronic device structure including a delta doped layer and/or a doped superlattice. A delta doping method is described, including the steps of: depositing semiconductor material on a substrate by a first epitaxial film growth process; terminating the deposition of semiconductor material on the substrate to present an epitaxial film surface; delta doping the semiconductor material at the epitaxial film surface, to form a delta doping layer thereon; terminating the delta doping; resuming deposition of semiconductor material to deposit semiconductor material on the delta doping layer, in a second epitaxial film growth process; and continuing the semiconductor material second epitaxial film growth process to a predetermined extent, to form a doped microelectronic device structure, wherein the delta doping layer is internalized in semiconductor material deposited in the first and second epitaxial film growth processes.

18 Claims, 14 Drawing Sheets

FOREIGN PATENT DOCUMENTS

| | | |
|---|---|---|
| EP | 1172859 A2 | 1/2002 |
| EP | 1 189 287 A1 | 3/2002 |
| JP | 10-248507 A | 10/1998 |
| JP | 10-294452 A | 11/1998 |
| JP | 2000-138368 A | 5/2000 |
| JP | 2000-323704 A | 11/2000 |
| JP | 2001-077353 A | 3/2001 |
| JP | 2001-274375 A | 10/2001 |
| JP | 2001284576 A | 10/2001 |
| JP | 2002-314072 A | 10/2002 |

OTHER PUBLICATIONS

Eastman et al, "Undoped . . . Amplification", IEEE Transactions on Electron Devices, vol. 48 No. 3 Mar. 2001 pp. 479-485.*
U.S. Appl. No. 09/605,195, filed Jun. 28, 2000, Jeffrey S. Flynn et al.
U.S. Appl. No. 09/179,049, filed Oct. 26, 1998, Robert P. Vaudo.
Zhao, et al., Applied Physics Letters, vol. 77, (14), Oct. 2, 2000, pp. 2195-2197.
Kim, et al., MRS Internet Journal of Nitride Semiconductors, Res. 4SI, G3.49 (1999).
Shashkin et al, "Control of charge transport mode of schottky barrier by delta doping: calculation and experiment for AlGaAs", Semiconductors 36, 505 (2002).
Jogai et al, "Free electron distribution in AlGaN/GaN heterojunction FET", J. Appl. Phys. 91, 3721 (2002).
Watanabe et al, "PL properties of delta-doped barrier layers in modulation doped InAlAs/InGaAs FET", J. Appl. Phys. 89, 1696 (2001).
Hubik et al, "Deep levels in GaAs due to Si delta doping", J. Appl. Phys. 88, 6488 (2000).
Dao et al, "PL in delta doping InGaAs/GaAs single quantum wells", J. Appl. Phys. 87, 3896 (2000).
Bouzaiene et al, "Improvement of electron density in the channel of an AlGaAs/GaAs heterojunction by introducing Si delta doping in the quantum well", J. Appl. Phys. 85, 8223 (1999).
O. Buchinsky, et al. "n-type delta-doped strained quantum well lasers for improved temperature-dependent performance", App. Phys. Lett. 72, 1484 (1998).
Babinski et al, "Subband electron densities of Si dleta-doped pseudomorphic InGaAs/GaAs heterostructures", Appl. Phys. Lett. 70, 3582 (1997).
Nara et al, Theoretical investigation of delta doping of Se atoms in GaAs, Appl. Phys. Lett. 70, 3534 (1997).
A.B. Henriques, et al., "Ionized impurity scattering in periodically delta doped InP", Phys. Rev. B 55, 13072 (1997).
O. Buchinsky, et al. "n-type delta doped quantum well lasers with extremely low transparency current density", Appl. Phys Lett 68, 2043 (1996).
Petravic et al, "Very high carbon dleta doping concentration in AlGaAs grown by MOVPE using trimethylaluminum as doping precursor", J. Appl Phys 79, 3554 (1996).
Schwabe et al, "Optical investigations of isovalent delta layers in III-V semiconductor layers", J. Appl. Phys. 77, 6295, (1995).
Sato et al, "Uniform and delta doping of Carbon in GaAs by solid source MBE", Appl. Phys. Lett. 66, 1791 (1995).
Ashwin et al, "The transition from dilute aluminum delta structures to an AlAs monolayer in GaAs and a comparison with Si delta doping", J. Appl. Phys. 76, 7627 (1994).
Wilks et al, "Investigation of silicon delta doped Gallium arsenide using Shubnikov de Haas effect and theoretical modeling", J. Appl. Phys 76, 3583 (1994).
Mendex et al, "Stark Ladders in periodically Si-delta doped GaAs", Phys. Rev. B 49, 11471 (1994).
Shieh et al, "Influences of delta doping time and spacer thickness on the mobility and two-dimensional electron gas concentration in delta doped GaAs/InGaAs/GaAs pseudomorphic heterostructures", Technology B 12, 154 (1994).
Munoz et al, "Tehniques to minimize DX center deleterious effect in III-V device performance", J. Appl. Phys. 73, 4988 (1993).
Young, et al., "Consequences of DQ centers on the charge distribution of double quantum wells, delta modulation doped heterostructures", J. Vac. Sci. Tech. B 13, 685 (1995).
Degani, et al., Electronic properties of multiple Si delta doping in GaAs, J. Appl. Phys. 70, 4362 (1991).
Henini et al, "Effect of Si delta doping and growth temperature on the I-V characteristics of MBE grown GaAs/ AlGaAs resonant tunneling devices", J. Vac. Sci Technology B 11, 958 (1993).
Dickmann et al, "Influence of delta doping position in the channel on th device performance of AlGaAs/InGaAs modulation-doped field effect transistors", Appl. Phys. Lett 60, 88 (1992).
Ihm et al, "Modulation of superlattice band structure via delta doping", Phs Rev B 44, 6266 (1991).
Pan et al, "Si delta doped FET by atmospheric pressure MOCVD", Appl. Phys. Lett. 59, 458 (1991).
Kim et al, "Selenium and Silicon delta-doping properties of GaAs by atmospheric MOCVD", J. Appl. Phys. 68, 2747 (1990).
Singh, Madhusudan, et al., Examination of tunnel junctions in the AlGaN/GaN system: Consequences of polarization charge, Appl. Phys. Lett., Sep. 18, 2000, pp. 1867-1869, vol. 77, No. 12.
Ambacher, O., et al., "Two dimensional electron gases induced by spontaneous and piezoelectric polarization in undoped and doped AlGaN/GaN . . . ", "Journal of Applied Physics", Jan. 1, 2000 pp. 334-344, vol. 87, No. 1, Publisher: American Institute of Physics.
Galczak, J. et al., "Spatial separation of recombining carriers within nitride GaN/(AlGa)N quantum wells induced by piezoelectric phenomena", "Opto-Electronics Review", 2004, pp. 369-376, vol. 12, No. 4.
Kowalski, O. P. et al., "GaInP-AlGaLnP band offsets determined from hydrostatic pressure measurements", "Applied Physics Letters", Jan. 30, 1995, pp. 619-621, vol. 66. No. 5, Publisher: American Institute of Physics.
Yen, Sun Tung et al., "Effects of doping in the active region of 630-nm band GaInP-AlGaIn P tensile strained quantum-well lasers", "IEEE Journal of Quantum Electronics", Sep. 1998, pp. 1644-1651, vol. 34, No. 9.
Dingle, R., et al., "Electron mobilities in modulation-doped semiconductor heterojunction superlattices", "Appl. Phys. Lett.", Oct. 1, 1978, pp. 665-667, vol. 33, No. 7.
Drummond, T. J., et al., "Dependence of electron mobility on spatial separation of electrons and donors in $AlxGa1_xAs/GaAs$ heterostructures", "J. Appl. Phys.", Mar. 1981, pp. 1380-1386, vol. 52, No. 3.
Fu, Y., et al., "Near-ballistic transport and current-voltage characteristics of a GaAs/AlGaAs heterojunction field effect transistor . . .", "J. Appl. Phys." , Nov. 15, 1997, pp. 5227-5230, vol. 82, No. 10.
Hiyamizu, Satoshi, et al., "Improved electron mobility higher than 10sup6cm2/Vs in selectively doped GaAs/N-AlGaAs heterostructures grown by MBE", "Japanese Journal of Applied Physics", Oct. 1983, pp. L609-L611, vol. 22, No. 10.
Katz, Oded, "Electron mobility in a AlGaN/GaN two-dimensional electron gas I-carrier concentration dependent mobility", "IEEE Transactions on Electron Devices", Oct. 2003, pp. 2002-2008, vol. 50, No. 10.
Matulionis, Arvydas, "Drift velocity limitation in GaN HEMT channels", "International Journal of High Speed Electronics and Systems", 2007, pp. 1518, vol. 17, No. 1.
Palacios, T., et al., "Nitride-based high electron mobility transistors with a GaN spacer", "Applied Physics Letters", 2006, pp. 073508-1-073508-4, vol. 89, No. 7.
Schubert, E. F., et al., "Si delta-doping of 011-oriented GaAs and $AlxGa1-xAs$ grown by molecular-beam epitaxy", "Appl. Phys. Lett.", Apr. 25, 1994, pp. 2238-2240, vol. 64, No. 17.
Seo, Sanghyun, "AlGaN/GaN high electron mobility transistors (HEMTs)", "EECS521 Winter Term Project Report", 2003, pp. 116.
Shen, B., et al., "Influence of strain relaxation of the $AlxGa1-xN$ barrier on transport properties of the two-dimensional electron gas . . . ", "Applied Physics Letters", May 8, 2000, pp. 2746-2748, vol. 76, No. 19.
Takeda, Y., et al., "Mobility calculation of two-dimensional electron gas in GaAs/AlGaAs heterostructure at 4-2 K", "Electronics Letters", Apr. 1, 1982, pp. 309311, vol. 18, No. 7.
Umansky, V., et al., "Extremely high-mobility two dimensional electron gas: evaluation of scattering mechanisms", "Appl. Physics Lett.", Aug. 4, 1997, pp. 683-685, vol. 71, No. 5.
Weimann, G., et al., "Molecular beam epitaxial growth and transport properties of modulation-doped AlGaAs-GaAs heterostructures", "Appl. Physics Lett.", Feb. 15, 1985, pp. 411-413, vol. 46, No. 4.

* cited by examiner

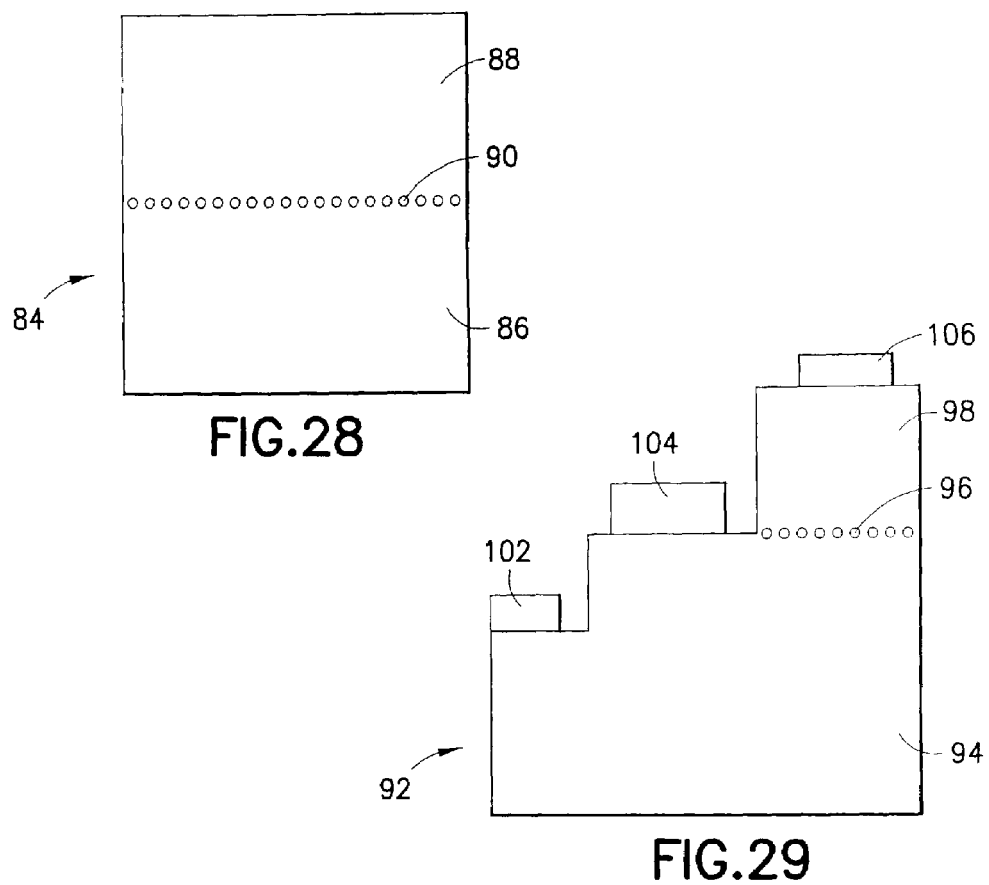
FIG.28
FIG.29
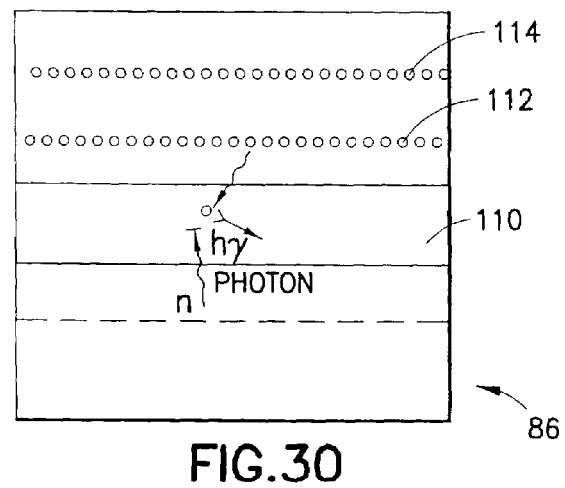
FIG.30

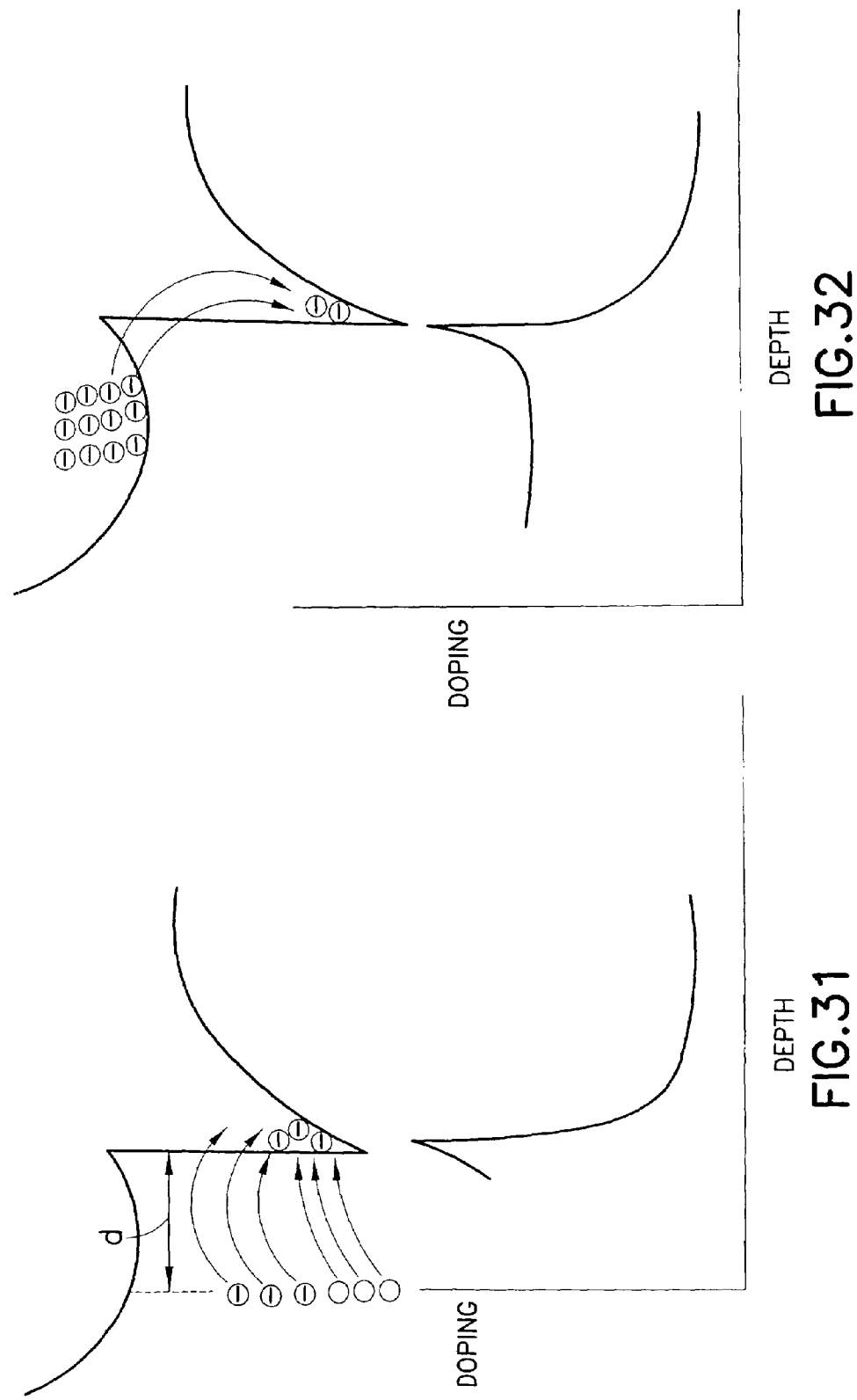

DOPED GROUP III-V NITRIDE MATERIALS, AND MICROELECTRONIC DEVICES AND DEVICE PRECURSOR STRUCTURES COMPRISING SAME

BACKGROUND OF THE INVENTION

1. Field of the Invention

This invention relates to doped Group III-V nitride materials, e.g., aluminum gallium nitride (AlGaN), gallium nitride (GaN) and indium gallium nitride (InGaN) materials, methods of forming such materials, and microelectronic devices and device precursor structures comprising such materials.

2. Description of the Related Art

Group III/V nitride semiconductors have significant potential as useful materials in high-temperature, high frequency and high power microelectronics and ultra-violet/blue/green optoelectronics by virtue of their wide bandgaps, high thermal conductivities and large electrical breakdown fields.

Microelectronic device applications include AlGaN—GaN multilayer-based laser diodes, high electron mobility transistors (HEMTs), field effect transistors (FETs), heterojunction bipolar transistors (HBTs), light emitting diodes (LEDs) and ultra-violet photodetectors, as well as (Al,In,Ga)N-based devices generally, including devices for high-frequency, high-power communications, for high-density optical storage, full-color displays, and for other wide bandgap semiconductor applications.

Aluminum gallium nitride (AlGaN) and gallium nitride (GaN) materials are particularly promising Group III-V nitride materials for next generation electronic and optoelectronic devices for wireless and optical communications systems. Nonetheless, Group III-V nitride materials have inherent limitations that pose challenges to their development and deployment.

More specifically, there is a need to improve the doping of III-V nitride semiconductor materials, to achieve the following:

a) increased carrier mobility;
b) broader doping ranges;
c) reduced dopant activation energy;
d) reduced resistivity associated with concurrent improvements of increased carrier mobility and broader doping ranges;
e) enhanced reproducibility of characteristics a)-d).
f) elimination of the need to activate the dopant impurity or alternatively of reducing the temperature/time requirement for dopant activation;
g) removal of active areas changes to the nitride material induced through incorporation of the impurity;
h) minimization of the changes to the nitride material resulting from incorporation of the dopant impurity; and
i) ability to selectively vary the properties of the doped III-V nitride material, e.g., resistivity (in contrast to (d) above, it may be desirable in some applications to increase resistivity, or to otherwise vary other material properties).

The art has not satisfactorily resolved these issues, which are addressed by the present invention.

SUMMARY OF THE INVENTION

The present invention relates to doped Group III-V nitrides, e.g., aluminum gallium nitride (AlGaN), indium gallium nitride (InGaN) and gallium nitride (GaN) materials, methods of forming such materials, and microelectronic devices and device precursor structures comprising such materials.

The present invention in one aspect contemplates delta doping of Group III-V nitrides, e.g., GaN and related nitrides, as well as superlattice doping of such materials.

As used herein, the term "Group III-V nitride" refers to semiconductor material including nitrogen and at least one of Al, In and Ga.

The present invention relates to Group III-V nitride materials, (Al,In,Ga)N and devices and device structures comprising such materials. The term (Al,In,Ga)N includes all permutations of nitrides including one or more of Al, In and Ga, and thus encompasses as alternative materials AlN, InN, GaN, AlInN, AlGaN, InGaN and AlInGaN, wherein the stoichiometric coefficients of Al, In, and Ga in compounds containing two, or all three, of such metals may have any appropriate values between 0 and 1 with the proviso that the sum of all such stoichiometric coefficients is 1. In this respect, impurities such as hydrogen or carbon, dopants, or strain-altering materials such as boron can also be incorporated in the (Al,In,Ga)N material, but the sum of all stoichiometric coefficients is 1 within a variation of ±0.1%. Examples of such compounds include $Al_xGa_{1-x}N$ wherein $0 \leq x \leq 1$, and $Al_xIn_yGa_{1-x-y}N$ wherein $0 \leq x \leq 1$ and $0 \leq y \leq 1$. Preferred materials of interest in the practice of the present invention include GaN and AlGaN.

In one aspect, the invention relates to a Group III-V nitride microelectronic device structure including a delta doped layer and/or a doped superlattice.

In another aspect, the invention relates to a Group III-V nitride microelectronic device structure including a delta doped layer.

The delta doped layer can for example be formed intermediate undoped III-V nitride layers of said device structure.

The Group III-V nitride layers can for example comprise AlGaN or GaN, and the delta doped layer may include a dopant species selected from the group consisting of Si, Ge, Mg, C, O, Ca, Zn, Li, Mn, Na, K, Cd, Rb, Sr, Sc and Be.

The microelectronic device structure can by way of example comprise a device structure selected from the group consisting of LEDs, laser diodes, AlGaN/GaN high electron mobility transistors (HEMTs), contact structures, isolation structures, AlGaN FETs, optoelectronic transistor detectors, tunnel doped structures, doped base heterojunction bipolar transistors (HBTs), and optical filters.

In another aspect, the invention relates to a Group III-V nitride microelectronic device structure including a doped III-V nitride superlattice.

Other aspects, features and embodiments of the invention will be more fully apparent from the ensuing disclosure and appended claims.

BRIEF DESCRIPTION OF THE DRAWINGS

FIG. 28 is a schematic view of a delta doped base NPN transistor according to one embodiment of the present invention.

FIG. 29 is a schematic view of a delta doped base heterojunction bipolar transistor (HBT) according to another embodiment of the present invention.

FIG. 30 is a schematic view of an emitter structure according to a further embodiment of the invention.

FIG. 31 is a plot of doping versus depth, and a corresponding tunneling energy diagram, for a tunnel doped HEMT device, delta doped in accordance with the invention, arranged for comparison with FIG. 32, a plot of doping versus depth, and a corresponding tunneling energy diagram, for a doped HEMT device that is doped by bulk doping.

DETAILED DESCRIPTION OF THE INVENTION AND PREFERRED EMBODIMENTS THEREOF

Figure 1:
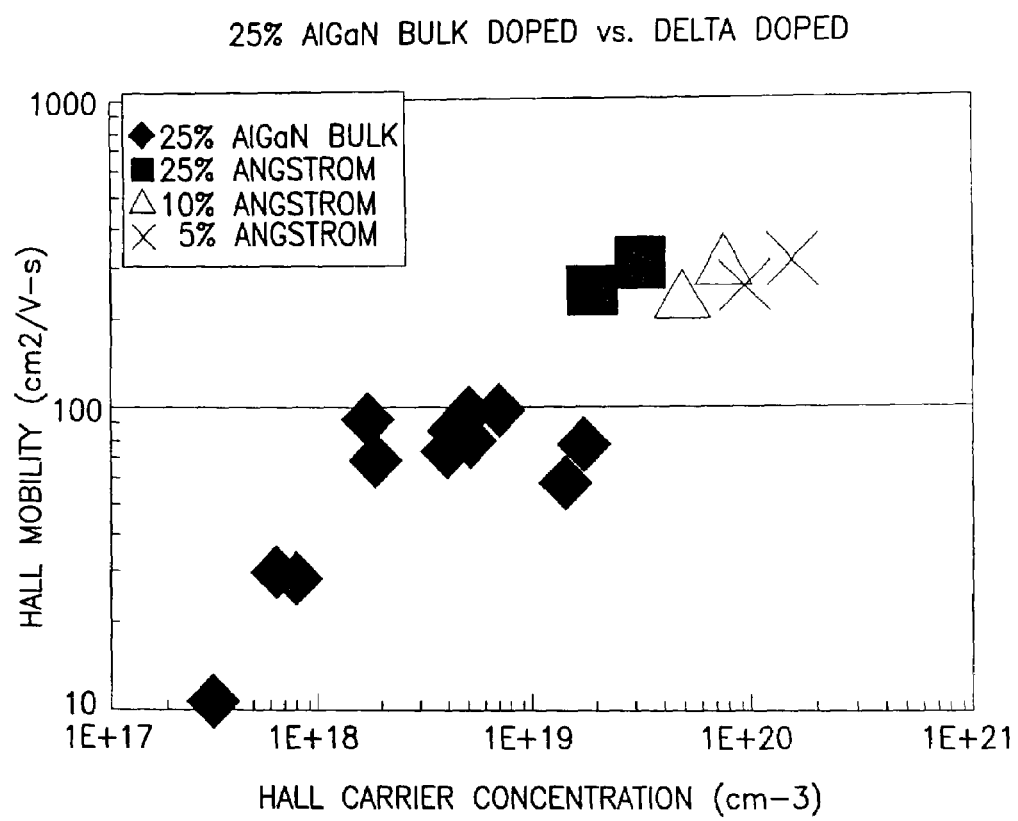
FIG. 1 is a plot of room temperature Hall mobility as a function of Hall carrier concentration for delta doped $Al_{0.25}Ga_{0.75}N$ layers and bulk doped structures (Hall carrier concentration in delta doped layers is defined as Hall sheet charge divided by layer thickness; C-V data shows layer thickness ranged from 5 to 25 Angstroms).

The disclosures of the following documents are hereby incorporated herein by reference in their respective entireties: Zhao et al, Applied Physics Letters, Vol. 77 (14), 2 Oct. 2000, pp 2195-2197; Kim et al, MRS Internet Journal of Nitride Semiconductors, Res 4S1, G3.49 (1999); U.S. patent application No. 09/605,195 filed Jun. 28, 2000 in the names of Jeffrey S. Flynn, et al. for "METHOD FOR ACHIEVING IMPROVED EPITAXY QUALITY (SURFACE TEXTURE AND DEFECT DENSITY) ON FREE- STANDING (ALUMINUM, INDIUM, GALLIUM) NITRIDE ((Al,In,Ga)N) SUBSTRATES FOR OPTO-ELECTRONIC AND ELECTRONIC DEVICES", subsequently issued on Jul. 22, 2003 as U.S. Pat. No. 6,447,604; U.S. patenta application No. 09/179,049 filed Oct. 26, 1998 in the names of Robert P. Vaudo, et al. for "LOW DEFECT DENSITY (Al,In,Ga)N AND HVPE PROCESS FOR MAKING SAME", subsequently issued on Aug. 27, 2002 as U.S. Pat. No. 6,440,823; and U.S. Pat. 6,156,581 issued Dec. 5, 2000 in the names of Robert P. Vaudo, et al. for "GaN-BASED DEVICES USING (Ga,Al,In)N BASED LAYERS."

Delta doping is a two-dimensional doping technique that enables a high concentration of dopant impurities to be placed in a very small volume in a semiconductor crystal. Ideally, a delta-doped layer is constituted by no more than one monolayer of a dopant impurity (n-type or p-type) placed into the host semiconductor crystal on the proper semiconductor site, III or V. Delta doping usually occurs when semiconductor crystal growth has been paused with the pre-pause, pause and post-pause conditions integral in forming a high quality delta-doped layer. The delta doping contemplated by the invention involves a monolayer or near-monolayer of dopant atoms on or in a semiconductor material. In the preferred practice of "paused doping," as hereinafter more fully described, the delta doping layer is typically internalized in a semiconductor material as a layer therein, by steps involving epitaxial growth of semiconductor material before and after the paused doping, so that the dopant atoms are intercalated in the semiconductor material in a layer therein.

In the event that the delta doped layer is utilized for a contact layer, the delta doped layer is exposed directly to the contact layer, and is not encapsulated or otherwise internalized in the semiconductor material, but rather is interposed between the semiconductor material and the metallization layer forming the contact element.

Delta doping therefore is a monolayer doping technique, in contrast to more conventional bulk doping techniques, which are used to incorporate impurities in a volume of semi-conductor crystal material that is much greater than a one monolayer thickness layer equivalent. It will be recognized that in the general practice of the invention, during the pause period, growth may still continue due to residual growth components in the reactor (particularly if the pre-pause period does not allow sufficient time to completely remove growth constituents) and in consequence the delta doping layer may be one or several atomic layers in thickness, such variation being contemplated within the general purview of delta doping in accordance with the invention, with respect to the preferred practice of obtaining a monolayer of dopant atoms in the semiconductor material.

Delta doping in accordance with the present invention is carried out by in-situ doping, utilizing a process such as metalorganic chemical vapor deposition (MOCVD), molecular beam epitaxy (MBE), hydride vapor phase epitaxy (HVPE), plasma etch chemical vapor deposition (PECVD), etc., wherein the dopant impurity is incorporated, implanted, annealed and preferentially segregated. The in-situ doping technique can be carried out in various embodiments to incorporate the dopant in Group III sites, or in Group V sites, or in interstitial sites of the Group III-V material, as may be desired in specific applications of the present invention.

Illustrative process conditions that are usefully employed for deposition of the Group III-V nitride semiconductor material, prior to and following delta doping in accordance with the invention, include temperature in a range of from about 400 to about 1200° C., pressure in a range of from about 1 to about 1000 torr, V/III ratio in a range of from about 1 to about 100,000, a pause period that is sufficient to enable the delta doping to be carried out to produce the desired delta doped layer in the semiconductor material, and an ambient environment for the doping operation that may alternatively comprise nitrogen, hydrogen, argon, helium, or other suitable single-component or multi-component gas species. Growth conditions are readily optimized within the skill of the art to maintain a predetermined low level of native defects and to minimize incorporation of extraneous, detrimental impurity in the grown material.

The doping operation is advantageously carried out at process conditions consistent with the epitaxial growth process, so that gross temperature fluctuations and variations in other process parameters are avoided, i.e., so that the doping is able to be integrated with the epitaxial growth process, in a continuous processing sequence.

Although such continuous processing sequence, involving epitaxial growth, cessation of film growth, doping, cessation of doping and re-initiation of epitaxial growth, is preferred, the delta doping may be carried out in a non-continuous manner. Thus, the initial epitaxial growth of (Al,In,Ga)N material may be carried out, and the resulting article may be stored or otherwise interrupted in relation to the subsequent performance of the delta doping operation.

Thereafter, when the doping has been completed, the doped semiconductor material article may be stored or otherwise delayed in respect of final epitaxial growth process, to form the semiconductor material within which the delta doped layer is contained.

The pre-pause through the post-pause steps can be repeated multiple times to yield a desired effect, e.g., the formation of multiple delta doped layers, each in spaced relationship to other delta doping layers.

Optimal interface conditions in the respective pre-pause, doping, and post-pause steps include a clean surface prepared for preferential incorporation of dopant (e.g., with surface preparation being carried out as a final pre-pause operation), controlled process conditions to minimize generation of defects, continuation of layer growth and incorporation of extraneous impurities, while controlling the position of incorporation (doping step), and controlled process conditions for reconstruction, segregation and redistribution of dopant impurities on the interface surface.

Concerning reconstruction, segregation and redistribution of dopant impurity deposits on the interface surface to form a delta doping layer, the present invention contemplates processing involving implantation, migration and localization steps as a delta doping technique.

By way of illustrative example, during the pre-pause step, the ion implantation mechanism is positioned in the reactor and growth conditions are adjusted to enable implant into the semiconductor crystal in the proper region(s) of the material. During the subsequent pause step, the implantation mechanism is activated and Si ions are introduced into the material. This is followed by a post-pause step of annealing, migrating or localizing the Si carriers to a specific dimension in the semiconductor crystal to form a preferred delta doped or modified delta doped structure (e.g., wherein the dopant impurity atoms are aggregated in a generally planar region, preferably having a thickness that does not exceed about 25 times the diameter (atomic diameter) of the dopant atom species, more preferably having a thickness that does not exceed about 15 times the diameter of the dopant atom species, and most preferably having a thickness that does not exceed about 10 times the diameter of the dopant atom species).

Pre-pause, pause and post-pause doping process steps may include, without limitation, additional semiconductor material preparation, restoration or modification steps for enabling high quality delta doping including temperature changes, ambient conditions changes, precursor changes, pressure changes, total flow changes, impurity addition changes, surfactant addition (to improve doped surface quality and homogeneity of dopant impurity incorporation), material etch or removal, select or localized area material removal and the like.

Delta doping in accordance with the invention achieves substantial mobility enhancement and sheet resistance reduction in the product III-V nitride material, relative to doped III-V nitride materials of the prior art. By way of specific example, delta doping of AlGaN in accordance with the invention has achieved mobility enhancements greater than a factor of two, as compared with corresponding bulk doped AlGaN material.

This improvement is shown by the data in FIG. 1, which is a plot of room temperature Hall mobility as a function of Hall carrier concentration for delta doped AlGaN layers. The delta doping data shown in FIG. 1 were generated by converting the delta doping sheet charge to a carrier concentration assuming different delta-doped layer thicknesses of 5, 10 and 25 Angstroms. The delta doped layer thickness was determined from the FWHM of C-V data (approximately 10 Angstroms). The delta doping data were compared to data from conventional 1-3 μm bulk doped AlGaN layers of equivalent aluminum composition of 25%. The data plotted in the graph of FIG. 1 show that delta doped structures exhibit much higher mobility at equivalent carrier concentration compared with bulk-doped structures. All data were determined at room temperature conditions.

Although we have not yet elucidated the specific mechanism for such substantial improvement in electron mobility, it is apparent that the magnitude of improvement affords a resolution of doping deficiencies heretofore associated with GaN and related materials systems. While not wishing to be bound by any theory as regards the nature or extent of the demonstrated improvement, it may be that the substantially increased electron mobility is attributable to strong piezoelectric effects in these III-V nitride materials from lattice strain in the region of the doped layer as well as other effects including modifications to the carrier—impurity interaction, reduced impurity scattering, reduced defects scattering and reduced phonon-phonon interactions.

The substantial improvement of electron mobility achieved by the present invention may be applied to realize contact resistivity improvements, improved p-type resistivities (e.g., in delta doped base heterojunction bipolar transistor (HBT) and laser device structures), enhanced device reliability and enhanced device performance characteristics, as well as the realization of new microelectronic device structures.

Figure 2:
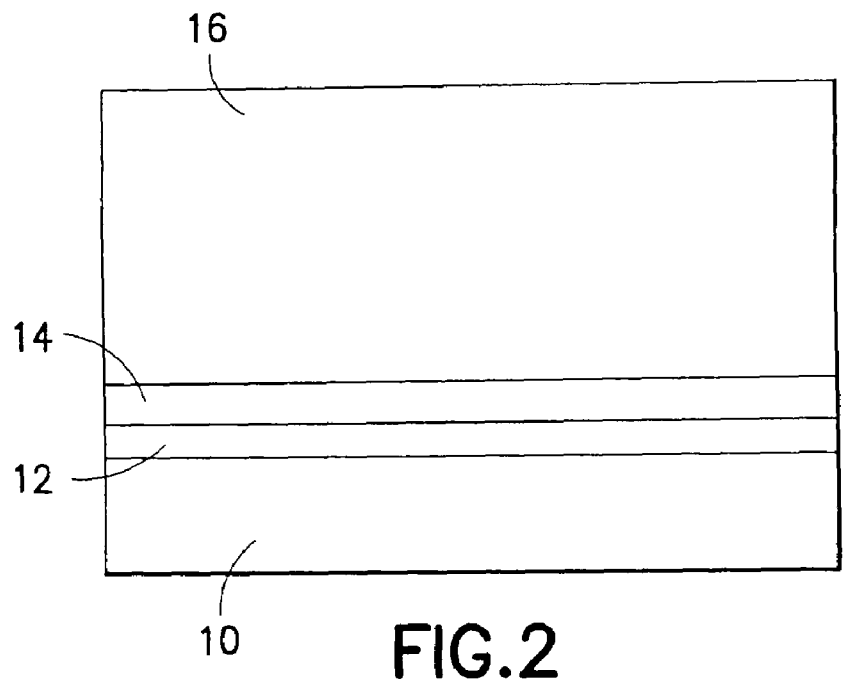
FIG. 2 is a schematic illustration of an undoped HEMT structure.
Figure 3:
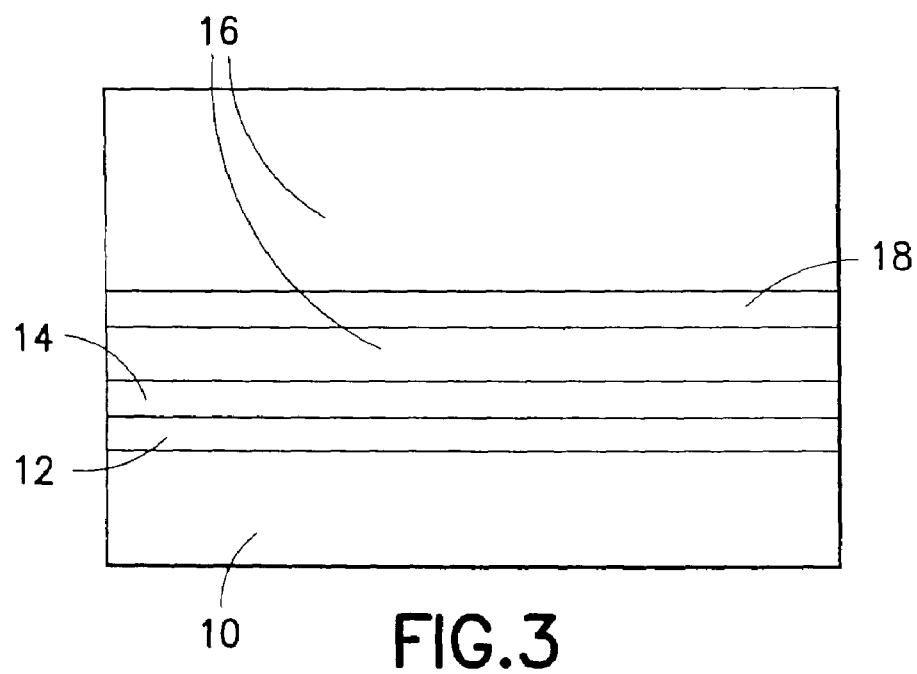
FIG. 3 is a schematic illustration of a delta-doped HEMT structure.

We have demonstrated the advantages and potential of the invention for enhanced electron mobility devices by fabricating two high electron mobility transistor (HEMT) structures and comparing their characteristics. The first structure (Structure A), shown in FIG. 2, is an undoped HEMT structure. The second structure (Structure B), shown in FIG. 3, is a delta doped HEMT structure. It will be recognized that gate, source, drain, passivation and other layers can be deposited in a conventional manner to complete the finished HEMT structure, within the skill of the art.

As shown in FIG. 2, the HEMT structure (Structure A) comprised a sapphire substrate 10 and buffer layer 12, as a base structure. The substrate 10 could alternatively have comprised GaN, SiC or any other suitable substrate material. The buffer layer was formed of AlN and was on the order of about 400 Angstroms in thickness. On this base structure was grown a GaN layer 14 that was 3 micrometers in thickness, and an $Al_{0.25}Ga_{0.75}N$ layer 16 that was 200 Angstroms in thickness.

The comparison Structure B is shown in FIG. 3 and comprised the same layers as in Structure A (all corresponding layers being correspondingly numbered with reference to the same numbers used in FIG. 2), except that the $Al_{0.25}Ga_{0.75}N$ layer 16 comprised a 30 Angstroms thick lower portion and a 170 Angstroms thick upper portion, with a silicon delta doped layer 18 therebetween. The delta doped layer 18 yields a $5\times10^{12}$ $cm^{-2}$ Hall sheet charge in a calibration structure consisting of thick $Al_{0.25}Ga_{0.75}N$ with a delta doped layer.

Figure 4:
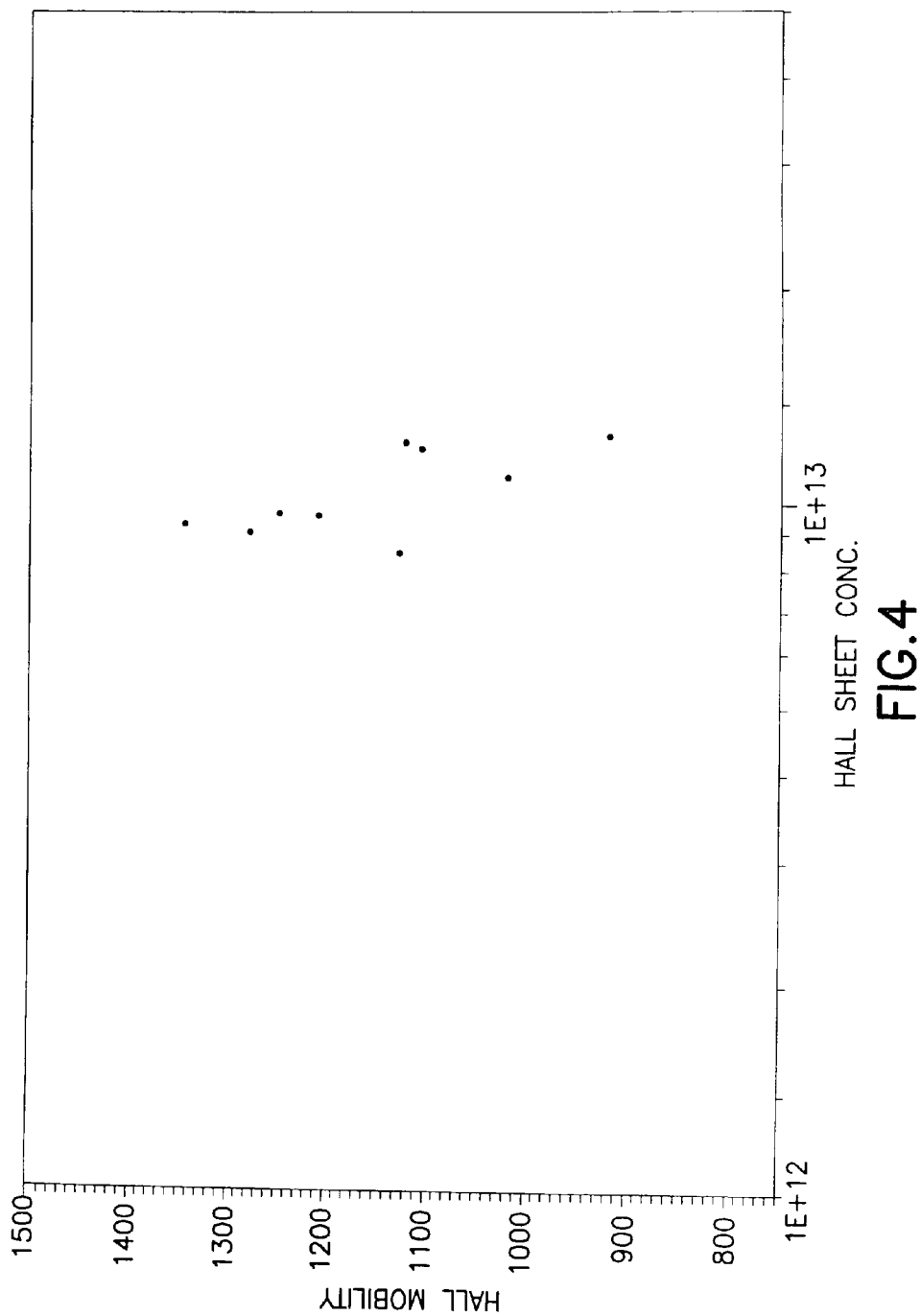
FIG. 4 is a plot of Hall mobility ($cm^2 V^{-1} s^{-1}$) vs. Hall sheet charge ($cm^{-2}$) for 300 Angstrom $Al_{0.30}Ga_{0.70}N$ HEMTs on sapphire.

In a prior art HEMT structure of the type shown in FIG. 2, increasing the sheet charge in the HEMT structure, results in a corresponding decrease in the electron mobility characteristics of the structure, as shown in FIG. 4. FIG. 4 is a plot of Hall mobility ($cm^2$ $V^{-1}$ $s^{-1}$) as a function of Hall sheet charge ($cm^{-2}$) for the 300 Angstrom thick $Al_{0.30}Ga_{0.70}N$ layer of an HEMT on a sapphire substrate (Structure A).

As shown in Table 1 below, the delta-doped structure (Structure B) does not demonstrate this detrimental effect of decreased electron mobility at increased sheet charge, but in fact demonstrates an equivalent mobility to the undoped HEMT structure (Structure A), at a much higher sheet charge.

TABLE 1

Hall characteristics of delta-doped (Structure B) and undoped (Structure A) HEMT structures

| Structure | RT Hall sheet charge (cm-2) | RT Hall mobility (cm2/V-s) |
| --- | --- | --- |
| Structure A | 7.97E12 | 1145 |
| Structure B | 1.17E13 | 1152 |

A further comparison Structure C was fabricated, having the same general structure and layers as schematically shown for Structure B in FIG. 3 (all corresponding layers being correspondingly numbered with reference to the same numbers used in FIG. 2), including a 30 Angstroms thick lower portion of the $Al_{0.25}Ga_{0.75}N$ layer 16, except that the upper portion of the $Al_{0.25}Ga_{0.75}N$ layer 16 was only 70 Angstroms in thickness and the intermediate layer 18 was bulk doped rather than being delta doped. The bulk doped layer 18 was 100 Angstroms in thickness, and contained a carrier concentration of $5\times10^{18}$ $cm^{-3}$ for an equivalent sheet charge of $5\times10^{12}$ $cm^{-2}$.

As shown by the results in Table 2 below, tabulating Lehighton Sheet Resistance (ohm/sq) for the various sample structures (Structures A, B and C), the delta-doped HEMT structure (Structure B) demonstrated improved sheet resistance as compared with a corresponding bulk doped HEMT structure (Structure C).

TABLE 2

Lehighton characteristics of undoped HEMT structure (Structure A), delta-doped HEMT (Structure B) and bulk doped HEMT (Structure C)

| Structure | Lehighton Sheet Resistance (ohm/sq) |
| --- | --- |
| Structure A | 547.6 |
| Structure B | 459.8 |
| Structure C | 542.8 |

Higher Uniformity Doping

Conventional bulk doping uniformity is a function of growth rate and precursor uniformity, gas phase flow uniformity and dopant precursor uniformity. In delta-doping, the growth rate uniformity variable is eliminated, thereby improving the ability to achieve uniform and more reproducible doping characteristics. Further, remaining factors affecting doping uniformity, including dopant concentration, delta-doping process conditions and delta-doping time, are susceptible to ready optimization within the skill of the art based on the disclosure herein, to provide a doping saturation condition that will yield a desired incorporation rate in the lattice.

Engineering Strain with Delta Doping

When strain is present between the delta doped layer and the host semiconductor matrix as a consequence of dopant atom size relative to the host lattice, delta doping level-dependent piezoelectric effects in III-V nitride materials systems such as GaN materials systems can play a large role in optimizing delta doped structures and device structures comprising same. For proper engineering of the piezoelectric properties deriving from the delta doped layer, a combination of multiple types of impurities (different lattice sizes, lattice location affinities and activation energies) can be employed for the delta-doped layer, including Si, Ge, Mg, C, O, Ca, Zn, Li, Mn, Na, K, Cd, Rb, Sr, Sc and Be. Further optimization of the piezoelectric properties can be effected by engineering the AlInGaN quaternary alloy mix in conjunction with the delta doping layer.

Improved Device Structure Stability

Sheet charge of an AlGaN HEMT is typically increased through increasing strain by correspondingly increasing AlGaN aluminum content and/or increasing thickness. To achieve reasonable sheet charges on the order of $10^{13}$ $cm^{-3}$, however, the critical thickness of the AlGaN barrier layer typically needs to be exceeded. This leads to an unstable device structure with a high potential for relaxation. One approach to avoiding this deficiency is growing the structure using an AlGaN layer with high Al content in the channel region (region 16 closest to layer 14) and then gradually grading it to lower Al content AlGaN away from the channel (away from the layer 14/layer 16 interface). Another approach to increasing sheet charge involves use of conventional techniques such as bulk doping of the barrier layer, but the thickness of the barrier layer still needs to be quite thick or the doping level needs to be extremely high, leading to material degradation.

We have found that incorporating a delta doping layer in the barrier layer yields a significantly enhanced charge contribution to the channel. We have demonstrated this for an AlGaN HEMT with a $5\times10^{12}$ $cm^{-2}$ sheet charge, as compared with bulk doping of the barrier layer with a $5\times10^{12}$ $cm^{-2}$ sheet charge (100 Angstroms, $5\times10^{18}$ $cm^{-3}$). The delta doped structure provided an improved charge contribution to the channel, as shown in FIGS. 5 and 6.

Figure 5:
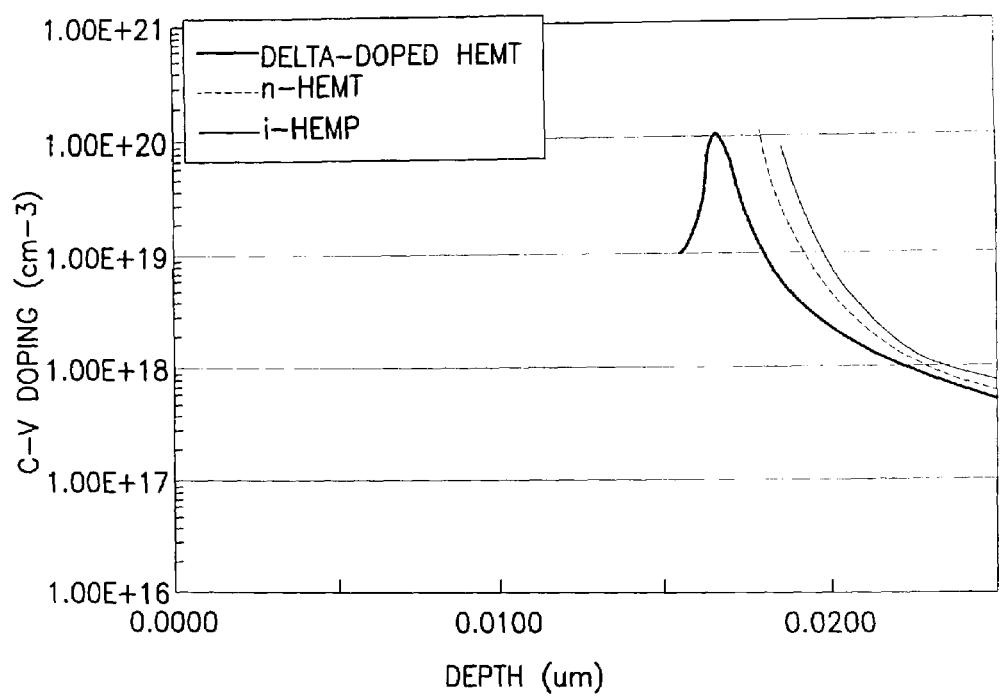
FIG. 5 is a plot of C-V doping ($cm^{-3}$) as a function of depth (μm), for an I-HEMT device of Structure A, a delta doped HEMT device of Structure B, and an n-HEMT of Structure C.

FIG. 5 is a plot of C-V doping ($cm^{-3}$) as a function of depth (µm), for an I-HEMT device of Structure A, a delta doped HEMT device of Structure B, and an n-HEMT of Structure C.

Figure 6:
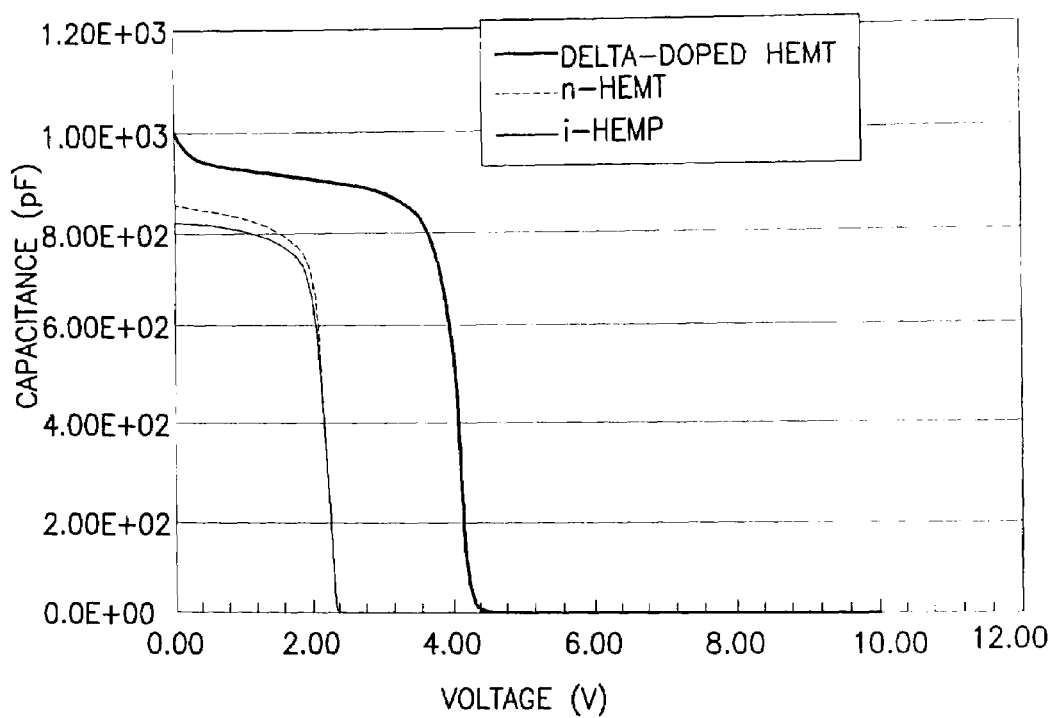
FIG. 6 is a plot of Capacitance (pF) as a function of voltage (V), for an I-HEMT device of Structure A, a delta doped HEMT device of Structure B, and an n-HEMT of Structure C.

FIG. 6 is a plot of capacitance (pF) as a function of voltage (V), for an I-HEMT device of Structure A, a delta doped HEMT device of Structure B, and an n-HEMT of Structure C.

These results demonstrate that lower thicknesses and lower aluminum contents can be achieved for delta doped structures with comparable characteristics to less stable thick, high aluminum content structures and bulk doped structures, thereby enabling more stable device structures to be achieved, below the critical thickness of the AlGaN layer. The ability to incorporate a delta doping layer to enhance charge contribution to the channel also gives the device structure designer another degree of freedom and enables the optimization of strain and resultant piezoelectric properties so that the highest reliability and highest performance device structure can be achieved.

An additional example of improved device structure stability relates to the position of the delta doped layer within the device structure. An optimal location will be present in each device depending on the application of the device and device performance needs. For instance, in a delta doped HEMT, preferred practice may include locating the delta doped layer in the barrier of the HEMT, in proximity to the channel, such that the distance between the delta doped layer and the channel is less than the tunneling distance of the charge carriers (FIG. 31).

Improved Optical Characteristics

When bulk doping GaN and AlGaN layers with dopant species such as Si or Mg, additional deep levels are generated, as evidenced by photoluminescence characteristics of the device structure. These deep levels are typically much lower energy than desired in the energy emission and transmission applications of interest in the Group III-V nitride materials, and as a consequence these deep levels can cause very poor light extraction efficiency for an emitter, very poor response for a detector, and very poor light transmission for a filter. Delta doping can be employed in accordance with the invention to mitigate the impact of these optically active defects, since delta doping provides a select, substantially mono-layer equivalent volume of doped material. Delta doping also is useful to reduce the layer or device structure sensitivity to light at energies lower than the bandgap of the semiconductor, thereby yielding improved noise characteristics for the corresponding semiconductor device.

Improved Device Characteristics

As discussed in the preceding section, bulk doping of III-V nitride materials such as GaN and AlGaN creates deep levels in the material. Utilizing delta doping to reduce the cross-section (volume) of the device layer that contains these deep levels will effect substantial improvements in device characteristics, including temperature stability, lifetime, leakage and breakdown characteristics.

In this respect, a delta doped barrier HEMT structure (Structure B) will exhibit improved breakdown and leakage characteristics when the device is pinched off, in comparison to a bulk doped HEMT structure (Structure C), since the Structure B device has fewer deep levels in it, therefore improving resistivity and reducing breakdown pathways.

Improved Device Fabrication

Figure 26:
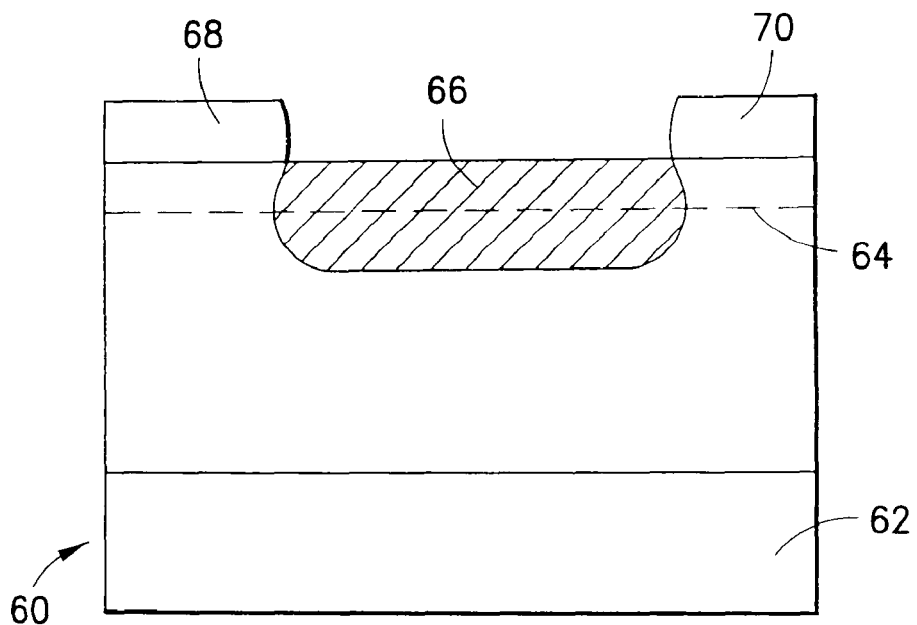
FIG. 26 is a schematic view of a delta doped contact and isolation structure, arranged for comparison with FIG. 27, a schematic view of a bulk doped contact and isolation structure, showing implant damage in the two device structures.
Figure 27:
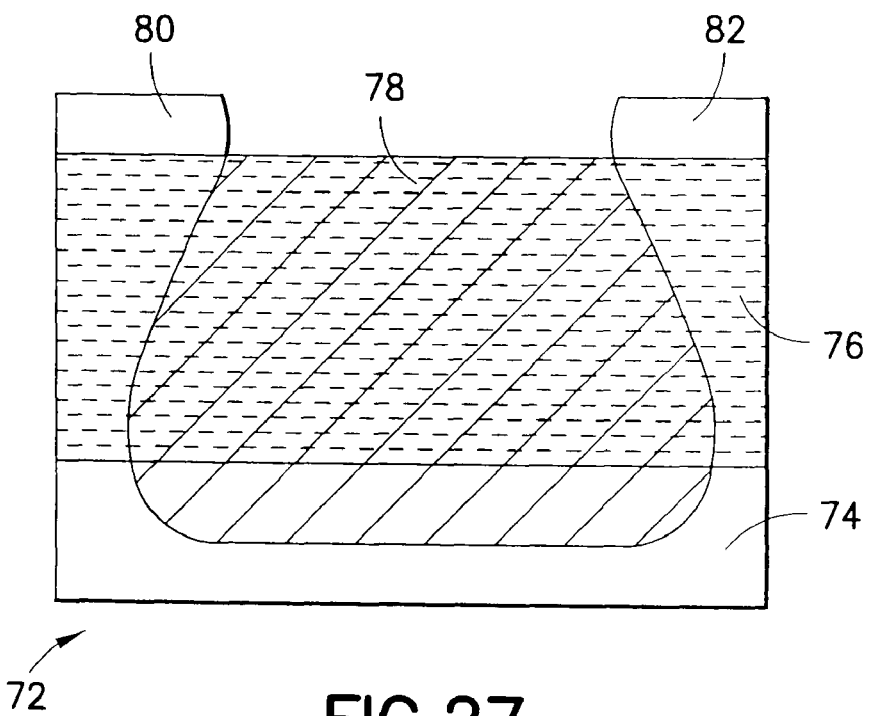

The delta doped layer can be engineered with respect to its location within the device, to thereby enable improved device fabrication, including for example the provision in the device structure of delta doped contact layers, isolation layers and interconnect layers. For example, a delta doped contact layer may be placed near the top of a HEMT device structure (region 16) to improve the ohmic contact behavior of the source or drain contact. The resulting device will be more readily and more reproducibly isolated via implant isolation than a bulk doped layer of equivalent resistivity, since the implant energy and time will be reduced. As a result, the implant volume and implant damage will be reduced substantially, thereby yielding improved device characteristics, including isolation, breakdown and leakage characteristics (FIGS. 26 and 27).

As another application of the delta doping contemplated by the present invention, a delta doped layer can be utilized in a further aspect of the invention as an etch stop, or alternatively a dopant signal obtained from the delta doped layer may be employed to identify etch depth that is desired in the fabrication of a particular semiconductor device or device precursor structure.

Figure 7:
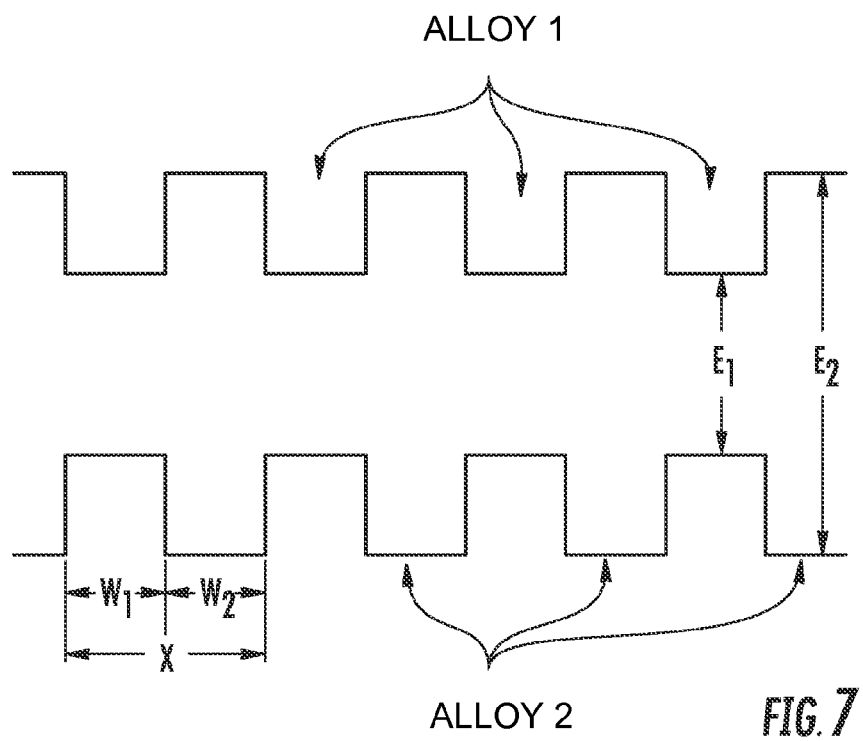
FIG. 7 is an energy bandgap diagram for a two alloy superlattice structure.
Figure 8:
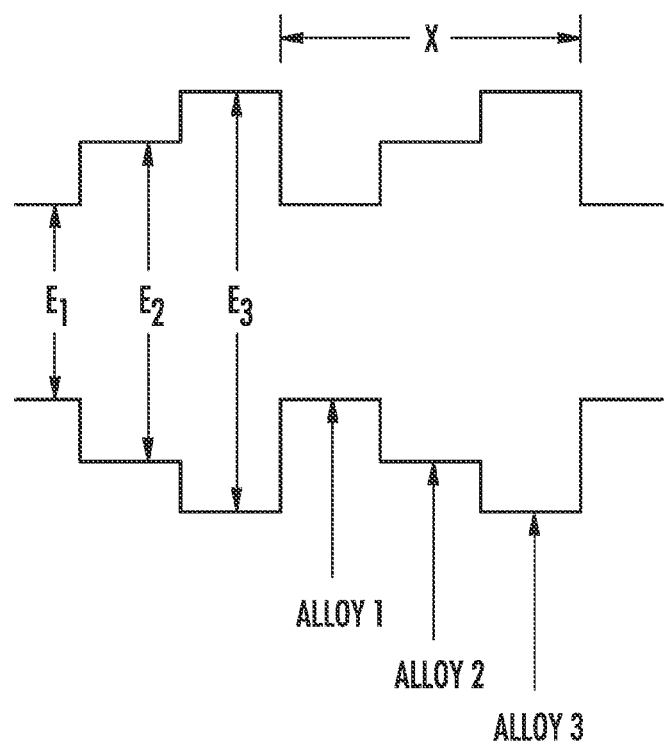
FIG. 8 is an energy bandgap diagram for a three alloy superlattice structure.

Devices formed with delta doped layers in accordance with the present invention may usefully be of any suitable type, including for example:
 a) contact and isolation structures
 b) high frequency AlGaN FETs or HEMTs
 c) generic delta doped structures and optical provisions
 d) opto-electronic transistor detector structures
 e) tunnel doped structures
 f) delta doped base HBTs (NPN)
 g) optical filters
 h) detectors Superlattice Structures Superlattice structures are structures in which the alloy composition changes in a regular or periodic manner across the material thickness, or a portion of the material thickness. The alloy composition usually changes between two compositions, the change is usually abrupt and the change in alloy composition usually results in a change of bandgap as shown in FIG. 7. The degree of abruptness is a consequence of the device fabrication technique employed. In principle, the superlattice could comprise three or more alloys as shown in FIG. 8, but for ease of ensuing description, superlattice structures will hereinafter be illustratively described as comprising two regions, hereafter denoted Region 1 and Region 2.

In semiconductors the period x (see FIG. 7) of the superlattice structure typically ranges from a few nanometers to a few tens of nanometers, but the range may be as small as 1 nanometers and as large as 500 nanometers in Group III-V nitride materials system. The number of periods in the superlattice and the width of the two alloy regions $w_1$ and $w_2$ can be varied as required by the device and its end use.

Figure 9:
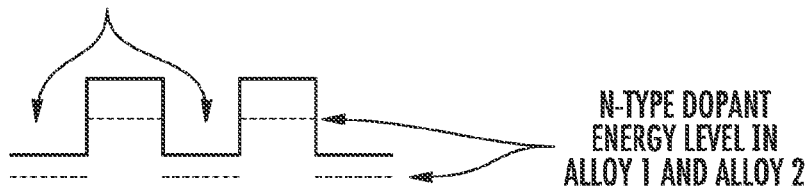
FIG. 9 is an energy bandgap for a superlattice structure having n-type doping in alloy 1 and alloy 2.
Figure 10:
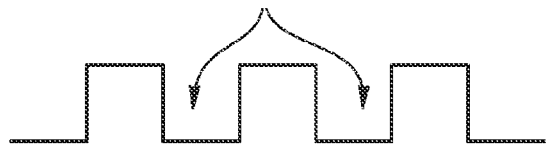
FIG. 10 is an energy bandgap for a superlattice structure having p-type doping in Region 1 only.
Figure 11:
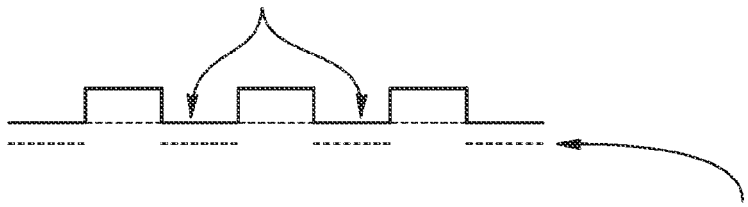
FIG. 11 is an energy bandgap for a superlattice structure having n-type doping at different concentrations in Region 1 and Region 2.

The superlattice may be doped in either alloy or in the individual alloy regions separately as shown in FIGS. 9, 10 and 11, showing n-type dopant energy levels in alloy 1 and alloy 2 (FIG. 9), p-type doping in Region 1 only (FIG. 10), and n-type doping with different concentrations in Region 1 and Region 2 (FIG. 11). In some cases, the concentration within each of the regions may be varied as well. For example, Region 1 might be n-type at a concentration of $1 \times 10^{17}$ $cm^{-3}$ and Region 2 n-type at a concentration of $5 \times 10^{17}$ $cm^{-3}$. The energy level of the dopant impurity will change with the bandgap in a manner consistent with the alloy composition, dopant concentration and the dimensions of the superlattice. As shown in FIG. 11, different doping concentrations in Region 1 and Region 2 may lead to a band offset.

Figure 12:
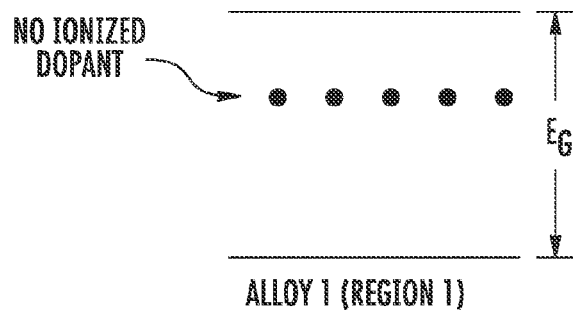
FIG. 12 is an energy diagram for Alloy 1, having no associated ionized dopant impurities.
Figure 13:
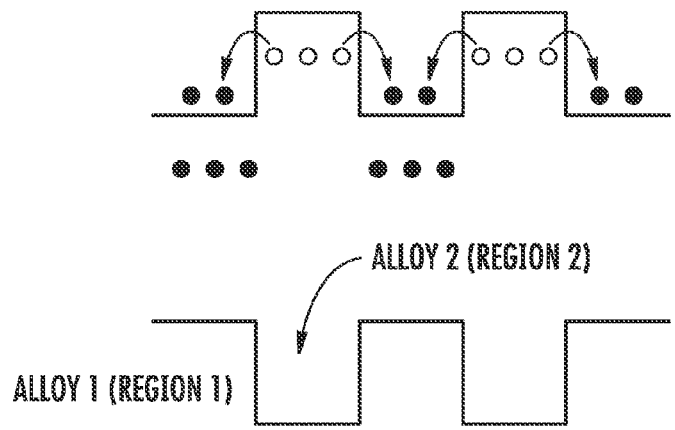
FIG. 13 is an energy diagram for a superlattice structure in which higher conductivity arises from carriers in Region 1 that originate from dopants in Region 2.

In one aspect of the invention, dopants that have a high activation energy may not contribute carriers for a particular temperature and alloy composition. See for example Alloy 1, which is shown in the energy diagram of FIG. 12 having no associated ionized dopant impurities. When this dopant is used in a superlattice structure comprising Alloy 1 and Alloy 2, in which the bandgap of Alloy 2 is greater than the bandgap of Alloy 1, the conductivity of the material is higher. The dopant may be incorporated in both regions or incorporated only in Region 2. The higher conductivity arises from carriers in Region 1 that originate from dopants in Region 2 as shown in the energy diagram of FIG. 13. Any dopants in Region 1 generally do not contribute in a meaningful manner, due to the temperature and composition of Region 1.

Mg is the commonly used dopant for p-type conduction in GaN and small Al content AlGaN, but it is difficult to achieve carrier concentrations in excess of $1\times10^{18}$ cm$^{-3}$ in GaN with Mg. For the reasons described above, Mg is a dopant species of preferred effectiveness. Alternative dopants for GaN and AlGaN superlattice structures include Ca, Na, K, Zn, Li, Cd, Rb, Sr, Sc and Be.

The width of Regions 1 and 2, the alloy composition of Region 2 (the Region 1 composition being defined by the specific end use application of the associated device structure), and the doping concentration in Regions 1 and 2 may be adjusted to attain a predetermined or otherwise desired level of conductivity.

When magnesium is used as a dopant impurity for GaN or AlGaN, the Mg doped GaN and Mg doped AlGaN require a high anneal temperature to activate the material, since any hydrogen that is present in the material will bond to the Mg impurity, or Mg complex, rendering it electrically inactive. Anneals are typically conducted under ammonia or nitrogen ambient in order to prevent decomposition, to free the hydrogen from its bound state and to enable it to diffuse out of the material. Piezoelectric GaN/AlGaN exhibits internal electric fields that serve to reduce the energy required for removing hydrogen. This feature of piezoelectric GaN/AlGaN allows anneals to be carried out with lower power/temperature requirements, with consequent cost savings. The anneal temperature may be sufficiently low to enable anneals to be conducted under non-nitrogen containing atmospheres without risk of GaN or AlGaN decomposition.

In accordance with another aspect of the invention, quaternary alloys are grown to produce superlattice structures for Group III-V nitride systems. The addition of a third impurity may be used to modify the strain and defect density inherent in the epitaxial layers.

While the preceding discussion has been directed to the changes attributable to superlattice structures on dopant activation and activation energy/carrier concentration characteristics, it is to be appreciated that improvements to other crystalline properties may occur simultaneously as a result of superlattice doping. For example, if the dopant activation energy is effectively changed in an epilayer of the superlattice, fewer dopant impurities are required and improvements in defect density and/or thermal conductivity may be achieved, relative to corresponding more highly doped layers. As a consequence, improvements in crystalline quality and thermal conductivity, as well as in optical, chemical and structural properties of the superlattice material, are achievable.

Superlattice structures in accordance with the present invention may be grown or produced by any suitable semiconductor manufacturing techniques appropriate therefor, including, without limitation, MOVPE, MBE, HVPE, sputter deposition (and optionally annealing), implant (and optionally annealing), and implant during growth processing by MOVPE, MBE or HVPE. MOVPE and MBE techniques are most preferred. Process conditions for such growth and production processes are readily determinable within the skill of the art for a given application of such aspect of the present invention.

The improved electrical conductivity of doped superlattice structures in accordance with the present invention enables the provision of improved ohmic electrical contacts (with lower specific contact resistivity). The higher carrier concentration attendant the presence of the doped superlattice structure will decrease the width of the metal-semiconductor barrier. Typical metals used to form contacts to GaN and AlGaN include Pd, Ni, Au, Re, Pt/Au, Pd/Au, and Ti/Pt/Au.

Improved p-type material formed by superlattice doping in accordance with the invention is usefully employed in one embodiment of the present invention to facilitate production of nitride photocathodes for solar blind detectors, particularly in high rate applications where substantial charge replacement capability (and therefore high material conductivity) is required or when only very short wavelength photons are to be detected.

The prior art has found it very difficult to make high Al content AlGaN p-type conductive. This deficiency is overcome by the p-type doped AlGaN materials of the present invention.

Figure 14:
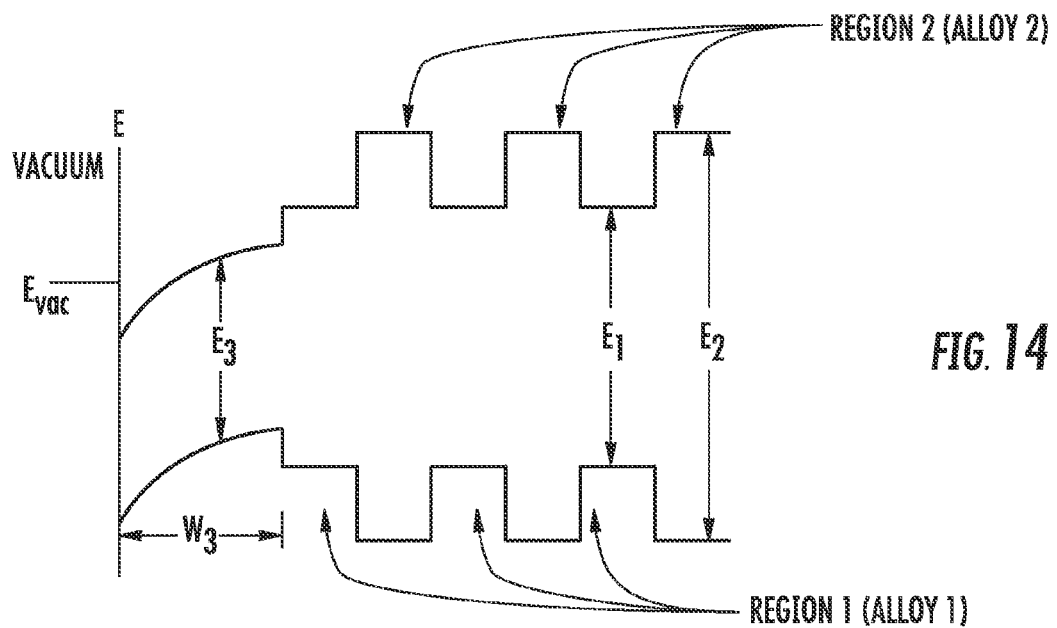
FIG. 14 is a schematic structure of a high Al content photocathode.

FIG. 14 shows a schematic structure of a high Al content photocathode. The Al content in Region 3 is selected so that the bandgap $E_3$ absorbs photons of the desired wavelength and allows longer wavelength photons to pass through. The width of Region 3 is chosen so that most photons of the desired wavelength are absorbed, but it is not so large that the electrons produced are likely to be reabsorbed before encountering the surface and emission into the vacuum. Based on an electron diffusion length in lightly doped p-GaN of ~0.2 micron, and a similar diffusion length obtaining in AlGaN, Region 3 will be a few tenths of a micron in thickness, depending in part on material quality, with poorer quality material preferably being thinner.

The Al content and width of Regions 1 and 2 are desirably selected to enable photons to pass through it without obstruction, and to provide suitable conductivity in and near Region 3.

The structure shown in FIG. 14 has a further benefit. The transition from Region 3 to Region 1 is an area in which the bandgap increases. Consequently, there is a potential barrier from which carriers will reflect. This reflective barrier increases the probability that a carrier created in Region 3 will be emitted (i.e., the photocathode will have a higher efficiency).

The doped superlattice material of the present invention is advantageously useful in a wide variety of electronic and optoelectronic devices, including unipolar and bipolar devices and two terminal and three or more terminal devices.

FIGS. 15-19 show a process flow for an epitaxial film deposition and delta doping process according to one embodiment of the invention.

Figure 15:
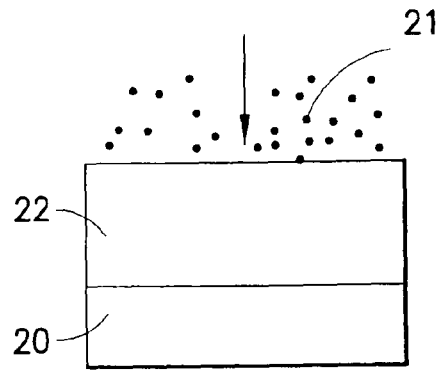
FIGS. 15-19 show a process flow for an epitaxial film deposition and delta doping process according to one embodiment of the invention.

FIG. 15 shows an epitaxial film 22 being deposited on substrate 20 from a precursor vapor 21, in an epitaxial film growth process. The same features of the article being formed are correspondingly numbered for ease of reference, in FIGS. 16-19.

Figure 16:
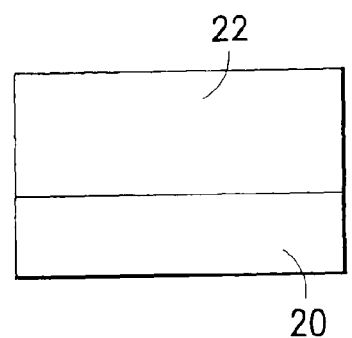

FIG. 16 shows the epitaxial growth as having been prepaused, by termination of the flow of the precursor vapor 21 (see FIG. 15). As a result, the epitaxial film 22 is interrupted in the deposition process.

Figure 17:
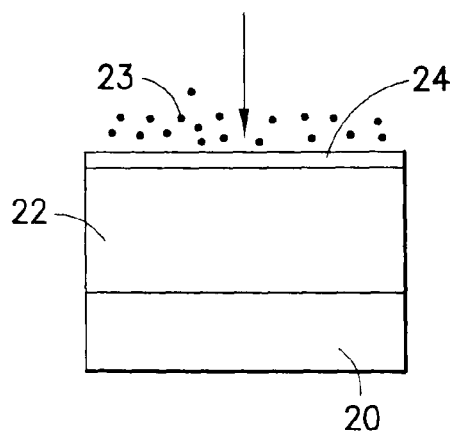
Figure 18:
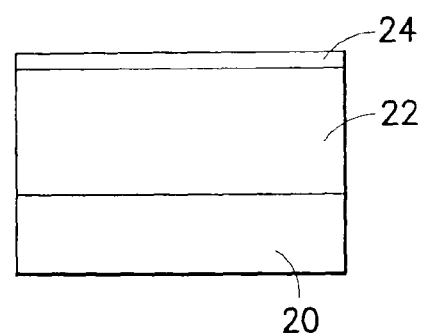
Figure 19:
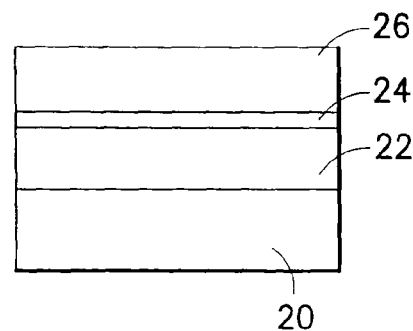

FIG. 17 shows the next step of contacting the epitaxial film with dopant from dopant source material 23 to form a delta dopant layer 24 of near monoatomic thickness on the epitaxial film 22. The dopant source material may comprise a dopant vapor that is highly dilute, e.g., in an inert carrier gas, for the formation of the near-monolayer deposit of dopant atoms on the surface of the epitaxial film 22. This is the pause step of the process.

After the delta doping layer 24 has been formed on the epitaxial film 22 during the pause step of the process, dopant deposition is terminated. There follows another quiescent step, of post-pause, during which no deposition or film formation is being conducted.

Next, the epitaxial film formation processing is resumed, with deposition of an additional epitaxial film 26 over the delta doping layer 24. In this manner, the dopant is internalized, or intercalated, in the epitaxial film made up of lower layer 22 and upper layer 26.

Figure 20:
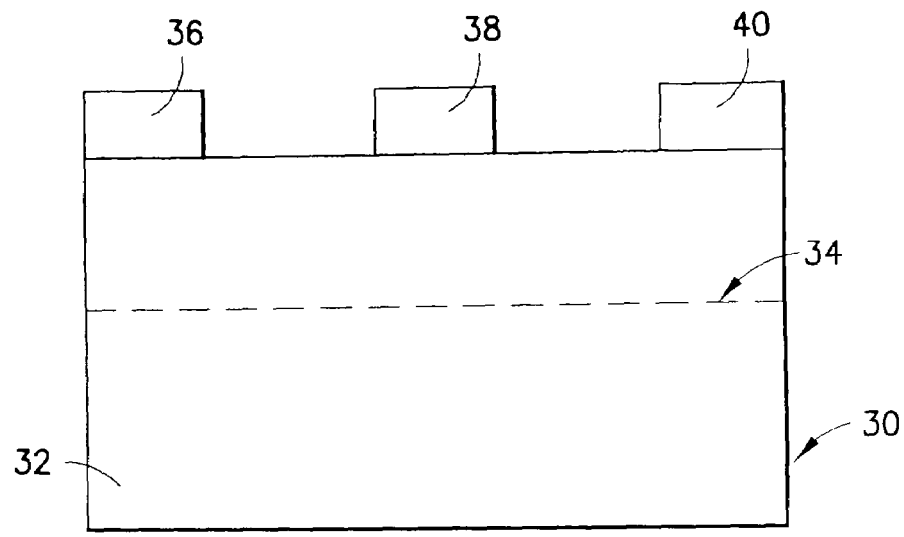
FIGS. 20, 22 and 24 show a delta doped high frequency field effect transistor (FIG. 20), a corresponding current/voltage curve for the device (FIG. 22) and a corresponding capacitance/voltage curve for the device (FIG. 24), arranged for comparison with FIGS. 21, 23 and 25, respectively, showing a bulk doped high frequency field effect transistor (FIG. 21), a corresponding current/voltage curve for the device (FIG. 23) and a corresponding capacitance/voltage curve for the device (FIG. 25).
Figure 21:
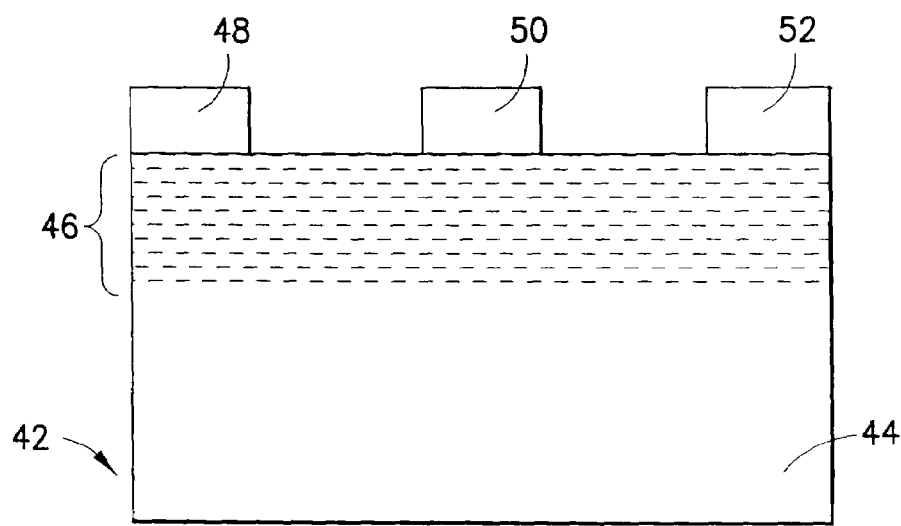
Figure 23:
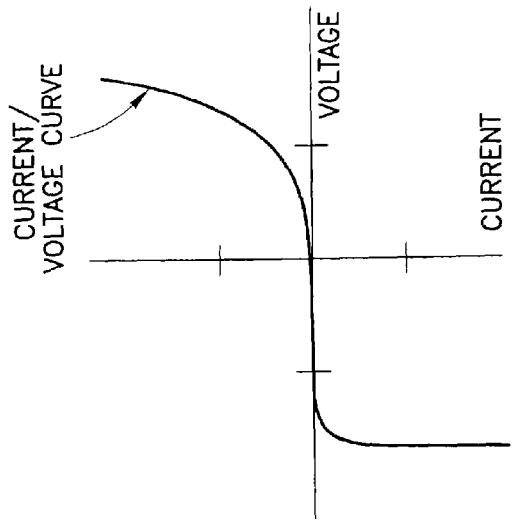
Figure 25:
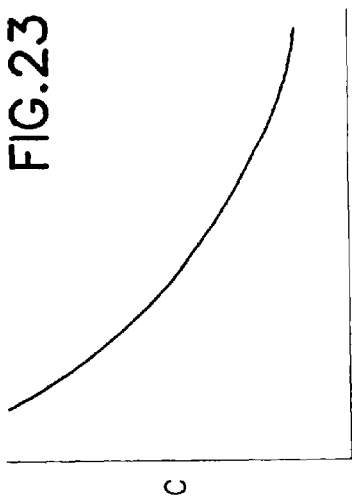
Figure 24:
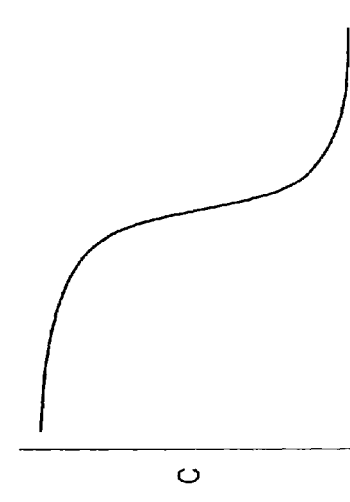
Figure 22:
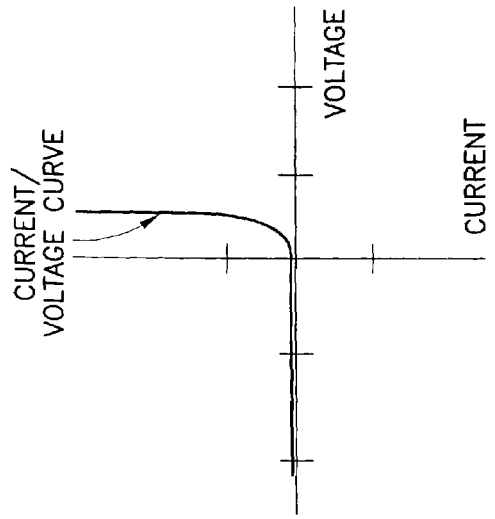

FIGS. 20, 22 and 24 show a delta doped high frequency field effect transistor (FIG. 20), a corresponding current/voltage curve for the device (FIG. 22) and a corresponding capacitance/voltage curve for the device (FIG. 24), arranged for comparison with FIGS. 21, 23 and 25, respectively, showing a bulk doped high frequency field effect transistor (FIG. 21), a corresponding current/voltage curve for the device (FIG. 23) and a corresponding capacitance/voltage curve for the device (FIG. 25).

FIG. 20 shows the delta doped high frequency field effect transistor 30 as comprising epitaxial semiconductor material 32 that has an intercalated delta doping layer 34. The device structure features source and drain ohmic contacts 36 and 40, and gate Schottky contact 38.

The current/voltage curve for the FIG. 20 device structure is shown in FIG. 22, and the capacitance/voltage curve for the FIG. 20 device structure is shown in FIG. 24.

FIG. 21 shows a corresponding bulk doped high frequency field effect transistor 42 comprising epitaxial semiconductor material 44 that is bulk doped in region 46 of the material with a same dopant species as the FET device structure of FIG. 20. The FET device structure includes source and drain ohmic contacts 48 and 52 and gate Shottky contact 50.

The current/voltage curve for the FIG. 21 device structure is shown in FIG. 23, and the capacitance/voltage curve for the device structure of FIG. 21 is shown in FIG. 25.

Comparison of FIG. 22 and FIG. 23, and comparison of FIG. 24 and FIG. 25, show that the performance characteristics of the delta doped FET device structure of FIG. 20 is markedly superior to the performance characteristics of the bulk doped FET device structure of FIG. 21.

FIG. 26 is a schematic view of a delta doped contact and isolation structure 60, arranged for comparison with FIG. 27, a schematic view of a bulk doped contact and isolation structure 72, showing implant damage in the two device structures.

The delta doped contact and isolation structure 60 shown in FIG. 26 features a device active layer 62 above which a delta doping layer 64 (of suitable n- or p-type dopant) is intercalated in the epitaxial semiconductor material. The structure features contacts 68 and 70. Implant damage is shown by cross-hatching.

The bulk doped contact and isolation structure 72 shown in FIG. 27 includes a device active layer 74 above which is a bulk doped region 76 of the semiconductor material. The contact and isolation structure 72 features contacts 80 and 82. The cross-hatched portion 78 of the semiconductor material extending down into the active layer 74 of the device evidences a far greater extent of implant damage than the delta doped structure of FIG. 26. The dopant species in the FIG. 27 device structure is the same as in the FIG. 26 device structure, and both structures have comparable resistance characteristics. Again, the delta doped structure of the present invention evidences a substantially lesser extent of implant damage, consistent with the superior operational characteristics of the contact and isolation structure shown in FIG. 26 over the bulk doped structure of FIG. 27.

FIG. 28 is a schematic view of a delta doped NPN transistor 84 according to one embodiment of the present invention. The transistor 84 includes an N collector portion 86 and an N emitter portion 88, between which is the delta doped P base layer 90 of the device.

FIG. 29 is a schematic view of a delta doped heterojunction bipolar transistor (HBT) 92 according to another embodiment of the present invention. The HBT device 92 includes an N collector portion 94, with associated contacts 102 and 104, with a delta doped P base layer 96, and with an upper N emitter (bandgap of emitter greater than bandgap of base) portion 98 having contact 106 formed thereon.

FIG. 30 is a schematic view of an emitter structure 108 according to a further embodiment of the invention. The emitter structure 108 includes an active region 110, with a lower n region, and an upper region containing delta doped p-type dopant layers 112 and 114. Photons are generated in the active region of the device structure, as shown, in operation of the device.

FIG. 31 is a plot of doping versus depth, and a corresponding tunneling energy diagram, for a tunnel doped HEMT device, delta doped in accordance with the invention, arranged for comparison with FIG. 32, a plot of doping versus depth, and a corresponding tunneling energy diagram, for a tunnel doped HEMT device that is doped by bulk doping. The distance d shown in the tunneling energy diagram is less than the tunneling distance of carriers in the operation of the HEMT device that is delta doped. By contrast, the energetics of charge carriers in the operation of the bulk doped HEMT are markedly less favorable, as is readily evident from a comparison of FIG. 31 and FIG. 32.

It will be apparent from the foregoing that the structural characteristics and operational function of delta doped microelectronic devices are substantially improved, and effect a major advance in the art of (Al,In,Ga)N materials and microelectronic/optoelectronic devices comprising same.

It will be appreciated, consistent with the introduction hereto, that although the invention has been described with particular reference to GaN and AlGaN herein in various embodiments, all Group III-V nitride materials (Al,In,Ga)N are contemplated as being within the broad scope of the invention herein described.

The features and advantages of the invention are more fully shown by the following illustrative and non-limiting examples of the invention.

EXAMPLE 1

Delta Doped HEMT Device Structure

A sapphire substrate was heated to 1170° C. in a $H_2$ environment at a pressure of 100 mbar for 10 minutes. With the pressure constant for the remainder of the delta doping structure growth, the reactor was cooled to 500° C., and a low temperature AlN nucleation buffer was deposited in a conventional manner. After the buffer layer was deposited on the sapphire, the reactor was heated to a susceptor temperature of 1220° C. under 2.5 slm of $NH_3$ and 20 slm of $H_2$, and the temperature was allowed to stabilize for 2 minutes.

Trimethylgallium (TMG) was introduced into the reactor at sufficient flux to provide a growth rate of approximately 2.0 μm/hr for 90 minutes, to deposit a GaN layer with a thickness of 3 microns. Trimethylaluminum (TMA) was introduced for 5.5 seconds to grow a 30 Angstroms thick $Al_{0.25}Ga_{0.75}N$ spacer layer.

Next, the pre-pause step was commenced by turning off the TMG and TMA to the reactor and the interface was left under an $NH_3$ and $H_2$ environment at a susceptor temperature of 1220° C. The pre-pause lasted 10 seconds. After the pre-pause steps, the pause step was commenced by introducing 55 ppm disilane ($Si_2H_6$ diluted in $H_2$) into the reactor for 75 seconds at a flux effecting delta doping of silicon.

After the pause step, the post-pause step was commenced by simultaneously turning off the disilane to the reactor and turning on the TMA and TMG to the reactor at the previously described process conditions (for pre-pause AlGaN growth) for 31.2 seconds, to grow an additional 170 Angstroms of $Al_{0.25}Ga_{0.75}N$. The V/III ratio was approximately 2500 for the GaN and AlGaN layers in this structure. Turning off the TMG and TMA to the reactor stopped the material growth. The grown material was cooled to less than 500° C. under a $NH_3$ and $H_2$ overpressure and the reactor pressure was ramped to 900 mbar, to produce a delta doped HEMT device structure.

EXAMPLE 2

Delta Doped Superlattice Structure

A sapphire substrate was heated to 1170° C. in a $H_2$ environment at 100 mbar for 10 minutes. With the pressure constant for the remainder of the delta doping structure growth, the reactor was cooled to 500° C. and a low temperature AlN nucleation buffer was deposited in a conventional manner. After the AlN buffer layer was deposited on the sapphire, the substrate was heated to a susceptor temperature of 1220° C. under a flow of 2.5 slm of $NH_3$ and 20 slm of $H_2$ and the temperature was allowed to stabilize for 2 minutes.

Trimethylgallium (TMG) was introduced into the reactor at an appropriate flux to provide a growth rate of approximately 2.0 µm/hr for 90 minutes, to deposit a GaN layer with a thickness of 3 microns. Trimethylaluminum (TMA) at an appropriate flux was introduced to grow an $Al_{0.2}Ga_{0.8}N$ layer.

Next, the pre-pause step was commenced by turning off the TMG and TMA to the reactor. The interface was left under an $NH_3$ and $H_2$ environment at a susceptor temperature of 1220° C. The pre-pause lasted 10 seconds. After the pre-pause, the pause step was commenced by introducing bis-cyclopentadienyl magnesium ($Cp_2Mg$) into the reactor for 75 seconds at a flux appropriate for Mg delta doping of the previously deposited film material.

After the pause step, the post-pause step was commenced by simultaneously turning off the $Cp_2Mg$ to the reactor and turning on the TMA and TMG to the reactor, at the same conditions employed in the pre-pause growth of AlGaN material. In this manner, an additional thickness of $Al_{0.2}Ga_{0.8}N$ was deposited. TMA then was turned off and a GaN layer was grown again Trimethylaluminum (TMA) was introduced to grow an $Al_{0.2}Ga_{0.8}N$ layer of appropriate thickness. The V/III ratio was approximately 2500 for the GaN and AlGaN layers in this structure. Turning off the TMG and TMA to the reactor stopped the material growth and the growth was cooled to less than 500° C. under a $NH_3$ and $H_2$ overpressure and the reactor pressure was ramped to 900 mbar to complete the delta doped superlattice structure.

EXAMPLE 3

Photocathode Structure

A sapphire substrate was heated to 1170° C. in a $H_2$ ambient environment at a pressure of 100 mbar for 10 minutes. With the pressure constant for the remainder of the delta doping structure growth, the reactor was cooled to 500° C. and a low temperature AlN nucleation buffer was deposited in a conventional manner. After the buffer layer of AlN was deposited on the sapphire substrate, the substrate was heated to a susceptor temperature of 1220° C. under a flow rate of 2.5 slm of $NH_3$ and 20 slm of $H_2$ and the temperature was allowed to stabilize for 2 minutes. Trimethylgallium (TMG) and trimethylaluminum (TMA) were introduced into the reactor to grow an $Al_{0.3}Ga_{0.7}N$ layer. Then the pre-pause step was commenced by turning off the TMG and TMA to the reactor and the interface was left under an $NH_3$ and $H_2$ ambient environment at a susceptor temperature of 1220° C. The pre-pause lasted 10 seconds. After the pre-pause step, the pause step was commenced by introducing bis-cyclopentadienyl magnesium ($Cp_2Mg$) into the reactor for 75 seconds to effect delta doping. After the pause step, the post-pause step was commenced by simultaneously turning off the $Cp_2Mg$ to the reactor and turning on the TMA and TMG to the reactor as the same process conditions employed to deposit the AlGaN film prior to the delta doping step, to growth additional thickness of $Al_{0.3}Ga_{0.7}N$. TMA flux was then modified to vary the stoichiometry of the AlGaN film to produce an $Al_{0.15}Ga_{0.85}N$ layer. Trimethylaluminum (TMA) flux then was increased to grow an $Al_{0.3}Ga_{0.7}N$ layer. Finally, the structure was capped with an Mg bulk doped GaN layer. The V/III ratio was approximately 2500 for the GaN and AlGaN layers in these structures. Turning off the TMG and TMA to the reactor stopped the material growth and the growth was cooled to less than 500° C. under a $NH_3$ and $H_2$ overpressure and the reactor pressure was ramped to a pressure of 900 mbar to complete the photocathode structure.

Although the invention has been variously disclosed herein with reference to illustrative embodiments and features, it will be appreciated that the embodiments and features described hereinabove are not intended to limit the invention, and that other variations, modifications and other embodiments will suggest themselves to those of ordinary skill in the art. The invention therefore is to be broadly construed, consistent with the claims hereafter set forth.

What is claimed is:

1. A Group III-V nitride microelectronic device structure comprising a high electron mobility transistor (HEMT) having a delta doped layer located in a barrier layer that is adjacent to a channel layer that provides a selectively operable conductive path between a source contact and a drain contact of the HEMT, wherein:

said barrier layer comprises a nitride of a metal or metal alloy that is compositionally different or stoichiometrically different from a nitride of a metal or metal alloy of the channel layer, with the barrier layer having a bandgap greater than a bandgap of the channel layer, and said delta doped layer and said channel layer are spaced apart by a distance of less than or equal to about 30 Angstroms.

2. The microelectronic device structure of claim 1, wherein said delta doped layer is intermediate undoped Group III-V nitride layers in said device structure.

3. The microelectronic device structure of claim 2, wherein said undoped Group III-V nitride layers comprise AlGaN.

4. The microelectronic device structure of claim 2, wherein said undoped Group III-V nitride layers comprise GaN.

5. The microelectronic device structure of claim 1, wherein said delta doped layer comprises a least one dopant species selected from the group consisting of Si, Ge, Mg, C, O, Ca, Zn, Li, Mn, Na, K, Cd, Rb, Sr, Sc and Be.

6. The microelectronic device structure of claim 1, comprising an AlGaN/GaN HEMT.

7. The microelectronic device structure of claim 1, wherein dopant in the delta doped layer is silicon.

8. The microelectronic device structure of claim 1, further comprising a substrate formed of a material selected from the group consisting of sapphire, SiC, and GaN.

9. The microelectronic device structure of claim 1, wherein the channel layer comprises GaN and the barrier layer comprises AlGaN.

10. The microelectronic device structure of claim 1, wherein the delta doped layer is arranged to improve ohmic contact behavior of a source contact or a drain contact of the HEMT.

11. The microelectronic device structure of claim 1, further comprising a GaN substrate.

12. The microelectronic device structure of claim 1, wherein the barrier layer is undoped except for the presence of the delta doped layer.

13. A microelectronic device structure comprising a high electron mobility transistor (HEMT) including:
    a source contact and a drain contact;
    a Group III-V nitride channel layer that provides a selectively operable conductive path between the source contact and the drain contact;
    a gate element adapted to regulate flow of current through the channel layer; and
    a Group III-V nitride barrier layer adjacent to the channel layer, the barrier layer having a bandgap that is greater than a bandgap of the channel layer;
    wherein a delta doped layer is defined within the barrier layer, and the delta doped layer is spaced apart from the channel layer by a distance of less than or equal to about 30 Angstroms.

14. The microelectronic device structure of claim 13, wherein the barrier layer comprises a nitride of a metal or metal alloy that is compositionally different or stoichiometrically different from a nitride of a metal or metal alloy of the channel layer.

15. The microelectronic device structure of claim 13, wherein the channel layer comprises GaN and the barrier layer comprises AlGaN.

16. The microelectronic device structure of claim 13, further comprising a GaN substrate.

17. The microelectronic device structure of claim 13, wherein said delta doped layer comprises at least one dopant species selected from the group consisting of Si, Ge, Mg, C, O, Ca, Zn, Li, Mn, Na, K, Cd, Rb, Sr, Sc and Be.

18. The microelectronic device structure of claim 13, wherein the barrier layer is undoped except for the presence of the delta doped layer.

* * * * *

UNITED STATES PATENT AND TRADEMARK OFFICE
CERTIFICATE OF CORRECTION

PATENT NO. : 7,919,791 B2
APPLICATION NO. : 10/107001
DATED : April 5, 2011
INVENTOR(S) : Jeffrey S. Flynn It is certified that error appears in the above-identified patent and that said Letters Patent is hereby corrected as shown below:

Title page 2, item [56] References Cited, Other Publications, second column, tenth entry: "GalnP-AlGaln P" should be -- GalnP-AlGalnP --.

Title page 2, item [56] References Cited, Other Publications, second column, thirteenth entry: "GaAs/AlGaAs" should be -- GaAs/AlGaAs --.

Title page 2, item [56] References Cited, Other Publications, second column, twenty-first entry: "GaAs/AlGaAs" should be -- GaAs/AlGaAs --.

Column 2, line 26: "$0 \leq y \leq 11$" should be -- $0 \leq y \leq 1$ --.

Column 4, line 9: "patenta application" should be -- patent application --.

Column 16, lines 47-54 (claim 1): "said barrier layer comprises a nitride of a metal or metal alloy that is compositionally different from a nitride of a metal or a metal alloy of the channel layer; and said delta doped layer and said channel layer are spaced apart by a distance of less than or equal to about 30 Angstroms" should be -- said barrier layer comprises a nitride of a Group III metal or Group III metal alloy that is compositionally different from a nitride of a Group III metal or a Group III metal alloy of the channel layer; and said delta doped layer and said channel layer are spaced apart by a distance of less than or equal to 30 Angstroms --.

Column 17, line 8 (claim 9): "AlGaN" should be -- AlGaN --.

Column 17, line 21 (claim 13): "channel layer that provides" should be -- channel layer adapted to provide --.

Column 18, lines 5-7 (claim 13): "less than or equal to about 30 Angstroms" should be -- less than or equal to 30 Angstroms --.

Signed and Sealed this
Fourteenth Day of August, 2012

David J. Kappos
*Director of the United States Patent and Trademark Office*

Column 18, line 9-12 (claim 14): "the barrier layer comprises a nitride of a metal or metal alloy that is compositionally different from a nitride of a metal or a metal alloy of the channel layer" should be -- the barrier layer comprises a nitride of a Group III metal or Group III metal alloy that is compositionally different from a nitride of a Group III metal or a Group III metal alloy of the channel layer --.